US012740290B2

(12) United States Patent
Lee et al.

(10) Patent No.: US 12,740,290 B2
(45) Date of Patent: Sep. 15, 2026

(54) DISPLAY DEVICE AND METHOD OF MANUFACTURING THE DISPLAY DEVICE

(71) Applicant: Samsung Display Co., LTD., Yongin-si (KR)

(72) Inventors: Youngmyung Lee, Yongin-si (KR); Jongnam Lee, Yongin-si (KR); Yuseok Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 363 days.

(21) Appl. No.: 18/239,432

(22) Filed: Aug. 29, 2023

(65) Prior Publication Data

US 2024/0138235 A1 Apr. 25, 2024
US 2024/0237487 A9 Jul. 11, 2024

(30) Foreign Application Priority Data

Oct. 21, 2022 (KR) ........................ 10-2022-0136842

(51) Int. Cl.
*H10K 50/84* (2023.01)
*H10K 59/80* (2023.01)

(52) U.S. Cl.
CPC .................................. *H10K 59/873* (2023.02)

(58) Field of Classification Search
CPC ....... B32B 3/263; H10K 50/84; H10K 50/842
USPC .................................................. 313/498–512
See application file for complete search history.

(56) References Cited

U.S. PATENT DOCUMENTS 10,766,222 B2 9/2020 Ozeki et al.
11,198,634 B2 12/2021 Moriya et al.
2014/0168060 A1* 6/2014 Liao ........................ G06F 1/163 345/156
2017/0179433 A1* 6/2017 Nam .................... H10K 59/131
2019/0069425 A1* 2/2019 Ryu .................. G02F 1/133308
2020/0209916 A1 7/2020 Zhang et al.
2020/0379595 A1* 12/2020 Kim ......................... G09G 3/32
2021/0325932 A1* 10/2021 Bushnell .............. G04G 9/0088
2022/0102675 A1 3/2022 Lee et al.
2022/0115621 A1 4/2022 Wang et al.
2022/0223820 A1 7/2022 Kang et al.
2022/0246878 A1* 8/2022 Sung ...................... H10K 50/84
2022/0255044 A1 8/2022 Kim et al.
(Continued)

FOREIGN PATENT DOCUMENTS

CN 114068621 A 2/2022
CN 114381209 A 4/2022
EP 4006987 A1 6/2022
(Continued)

*Primary Examiner* — Christopher M Raabe
(74) *Attorney, Agent, or Firm* — CANTOR COLBURN LLP

(57) ABSTRACT

A display device includes a display panel including corner areas and a cover window, where the display panel includes a substrate and a plurality of pixels on the substrate, the substrate including a display area, a first peripheral area, and a second peripheral area. The display area includes a front display area, a corner display area and a side display area, the cover window includes a flat area and a curved area, the curved area includes a first curved area overlapping the corner display area and a second curved area extending from the first curved area, and the thickness of the second curved area is less than the thickness of the first curved area.

21 Claims, 25 Drawing Sheets

(56) References Cited

U.S. PATENT DOCUMENTS

2023/0015869 A1* 1/2023 Lee .......................... B32B 7/12

FOREIGN PATENT DOCUMENTS

KR 102391877 B1 4/2022
KR 20220043970 A 4/2022

* cited by examiner

DISPLAY DEVICE AND METHOD OF MANUFACTURING THE DISPLAY DEVICE

This application claims priority to Korean Patent Application No. 10-2022-0136842, filed on Oct. 21, 2022, and all the benefits accruing therefrom under 35 U.S.C. § 119, the content of which in its entirety is herein incorporated by reference.

BACKGROUND

1. Field

One or more embodiments relate to a display device and a method of manufacturing the display device.

2. Description of the Related Art

Mobility-based (or portable) electronic devices have been widely used in various fields. As mobile or portable electronic devices, not only compact electronic devices such as mobile phones, but also tablet personal computers (PCs) have been recently widely used.

Such mobile or portable electronic devices typically include a display device to provide various functions, for example, visual information such as images or videos, to a user. Recently, as other components to drive a display device are miniaturized, the share of the display device in an electronic device is gradually increasing, and a structure to bend the display device from a flat state to have a certain angle is under development.

SUMMARY

One or more embodiments are directed to a display device which may prevent or reduce buckling of a display panel that may occur when the display panel including a curved surface curved in various directions and/or with various radii of curvature is attached to a cover window, and a method of manufacturing the display device.

According to one or more embodiments, a display device includes a display panel including corner areas and a cover window disposed on the display panel, where the display panel includes a substrate and a plurality of pixels on the substrate, the substrate including a display area, a first peripheral area, and a second peripheral area, the display area including a front display area, a corner display area bent in each of the corner areas, and a side display area arranged at a side of the front display area, where the first peripheral area is arranged outside the corner display area, the second peripheral area is arranged outside the side display area, and the plurality of pixels is arranged in the display area. In such embodiments, the cover window includes a flat area overlapping the front display area and a curved area bent with respect to the flat area, the curved area includes a first curved area overlapping the corner display area and a second curved area extending from the first curved area and overlapping the first peripheral area, and a thickness of the second curved area is less than a thickness of the first curved area.

In an embodiment, the second curved area may include a first end portion in contact with the first curved area and a second end portion opposite to the first end portion, and a thickness of the second end portion may be less than a thickness of the first end portion.

In an embodiment, the thickness of the second end portion of the second curved area may be in a range of 60% to 90% of the thickness of the first curved area.

In an embodiment, the thickness of the second curved area may decrease as being away from the first curved area.

In an embodiment, the thickness of the first curved area may be uniform.

In an embodiment, the thickness of the first curved area may be the same as the thickness of the flat area.

In an embodiment, the curved area may further include a third curved area overlapping the side display area and a fourth curved area extending from the third curved area and overlapping the second peripheral area.

In an embodiment, the thickness of each of the third curved area and the fourth curved area may be uniform.

In an embodiment, the thickness of the third curved area may be the same as the thickness of the flat area.

In an embodiment, the thickness of the fourth curved area may be less than the thickness of the third curved area.

In an embodiment, the thickness of the fourth curved area may decrease as being away from the third curved area.

According to one or more embodiments, a display device includes a display panel including corner areas, and a cover window disposed on the display panel, where the display panel may include a substrate and a plurality of pixels, the substrate including a display area, a first peripheral area, and a second peripheral area, the display area including a front display area, a corner display area bent in each of the corner areas, and a side display area arranged at a side of the front display area, where the first peripheral area is arranged outside the corner display area, the second peripheral area is arranged outside the side display area, and the plurality of pixels is arranged in the display area. In such embodiments, the cover window includes a flat area overlapping the front display area and a curved area bent with respect to the flat area, the curved area includes a first curved area overlapping the corner display area, a second curved area extending from the first curved area and overlapping the first peripheral area, a third curved area overlapping the side display area, and a fourth curved area extending from the third curved area and overlapping the second peripheral area, and the thickness of the second curved area is less than the thickness of the first curved area, and the thickness of the third curved area is the same as the thickness of the fourth curved area.

In an embodiment, the second curved area may include a first end portion in contact with the first curved area and a second end portion opposite to the first end portion, and the thickness of the second end portion may be less than the thickness of the first end portion.

In an embodiment, the thickness of the second end portion of the second curved area may be in a range of 60% to 90% of the thickness of the first curved area.

In an embodiment, the thickness of the second curved area may decrease as being away from the first curved area.

In an embodiment, the thickness of the first curved area may be uniform.

In an embodiment, each of the thickness of the first curved area and the thickness of the third curved area may be the same as the thickness of the flat area.

According to one or more embodiments, a display device includes a display panel including a substrate and a plurality of pixels on the substrate, the substrate including a display area and a peripheral area arranged outside the display area, where the plurality of pixels is arranged in the display area, and a cover window disposed on the display panel, where the cover window may include a flat area having a flat surface and a curved area having a curved shape and overlapping a portion of the display area and a portion of the peripheral area, and a portion of the curved area overlapping the peripheral area has a thickness decreasing as being away from the flat area.

In an embodiment, the display panel may include corner areas, and the display area may include a front display area, a corner display area bent in each of the corner areas, and a side display area arranged at a side of the front display area between the corner areas.

In an embodiment, the peripheral area may include a first peripheral area arranged outside the corner display area in each of the corner areas, and a second peripheral area arranged outside the side display area, the curved area may include a first curved area overlapping the side display area and a second curved area overlapping the first peripheral area, and the second curved area may have the thickness decreasing as being away from the first curved area.

In an embodiment, each of the display panel and the cover window may be circular.

According to one or more embodiments, a method of manufacturing a display device includes preparing a cover window including corner areas, deforming the cover window to include a flat area and a curved area; forming a first curved area and a second curved area by removing a portion of the cover window in some areas of the curved area; and attaching the cover window to a display panel.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1A:
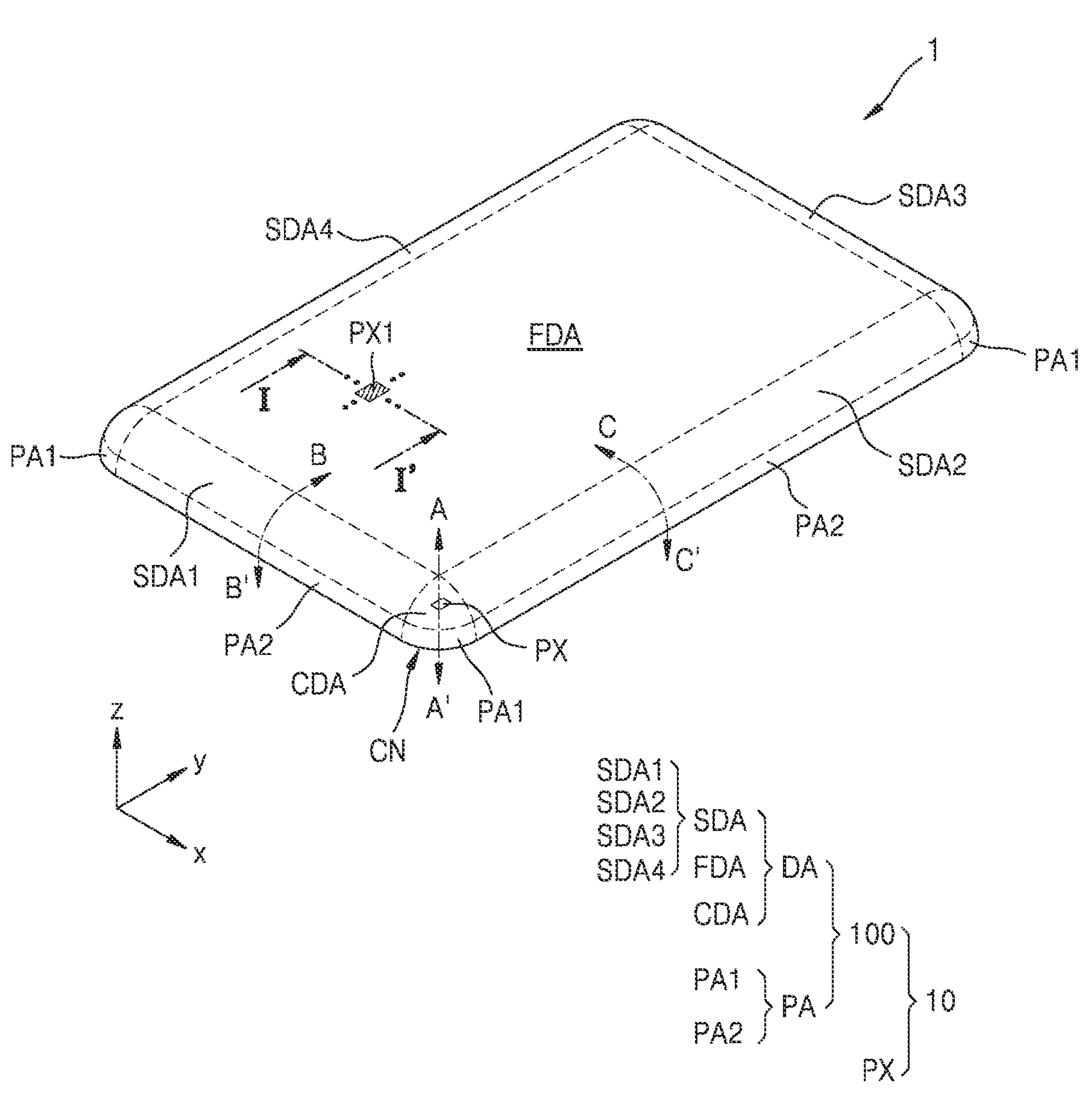
FIG. 1A is a schematic perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As used herein, the term "and/or" includes any and all combinations of one or more of the associated listed items. "or" means "and/or." Throughout the disclosure, the expression "at least one of a, b or c" or "at least one selected from a, b and c" indicates only a, only b, only c, both a and b, both a and c, both b and c, all of a, b, and c, or variations thereof.

Various modifications may be applied to the embodiments described herein, and particular embodiments will be illustrated in the drawings and described in the detailed description section. The effect and features of the present embodiments, and a method to achieve the same, will be clearer referring to the detailed descriptions below with the drawings. However, the embodiments may be implemented in various forms, not by being limited to the embodiments described herein.

In the following embodiment, it will be understood that when a component, such as a layer, a film, a region, or a plate, is referred to as being "on" another component, the component can be directly on the other component or intervening components may be present thereon. Sizes of components in the drawings may be exaggerated or reduced for convenience of explanation. For example, since sizes and thicknesses of components in the drawings are arbitrarily illustrated for convenience of explanation, the following embodiments are not limited thereto.

In the following embodiment, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the following embodiment, while such terms as "first," "second," etc., may be used to describe various components, such components must not be limited to the above terms. The above terms are used only to distinguish one component from another.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an.".

In the following embodiment, it will be further understood that the terms "comprises" and/or "comprising" or "includes" and/or "including" used herein specify the presence of stated features or components, but do not preclude the presence or addition of one or more other features or components.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the specification, the expression such as "A and/or B" may include A, B, or A and B. The expression such as "at least one of A and B" or "at least one selected from A and B" may include A, B, or A and B.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings, and in the description with reference to the drawings, the same or corresponding constituents are indicated by the same reference numerals and any repetitive detailed descriptions thereof may be omitted or simplified.

Figure 1B:
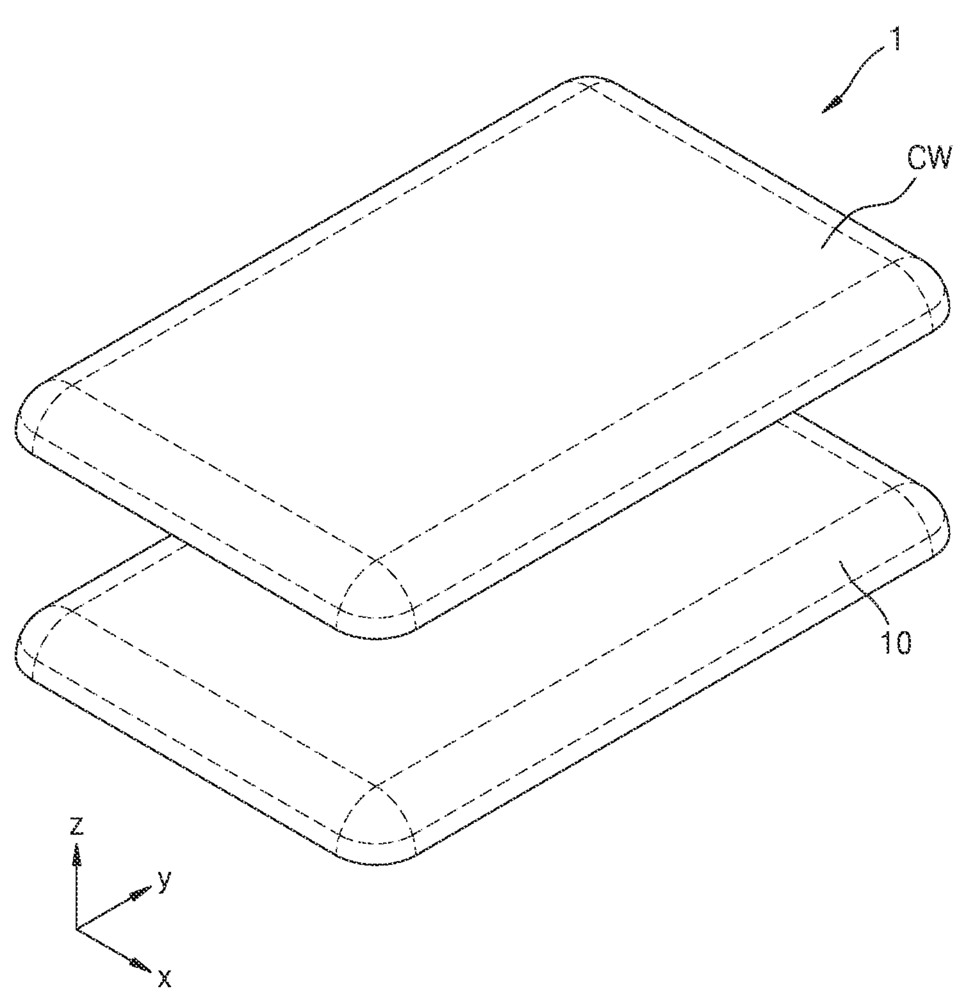
FIG. 1B is a schematic exploded perspective view of the display device of FIG. 1A.
Figure 2:
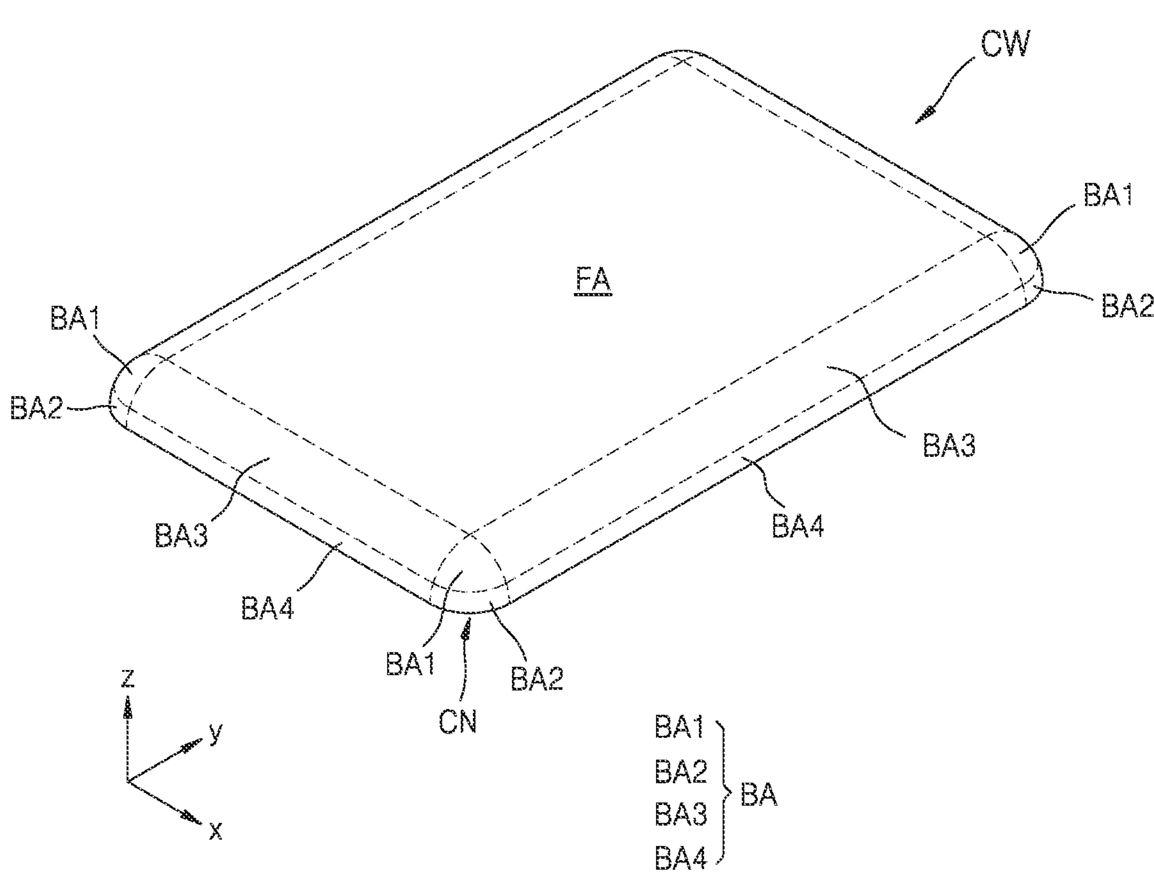
FIG. 2 is a schematic perspective view of a cover window of the display device of FIG. 1A.

FIG. 1A is a schematic perspective view of a display device 1 according to an embodiment. FIG. 1B is a schematic exploded perspective view of the display device 1 of FIG. 1A. FIG. 2 is a schematic perspective view of a cover window CW of the display device 1 of FIG. 1A.

Referring to FIGS. 1A to 2, an embodiment of the display device 1 may include the display panel 10 and the cover window CW.

The display device 1 is a device for displaying a video or a still image, and may be a portable electronic device, such as a mobile phone, a smart phone, a tablet personal computer (PC), a mobile communication terminal, an electronic organizer, an electronic book, a portable multimedia player (PMP), a navigation device, an ultra-mobile PC (UMPC), or the like. The display device 1 may be an electronic device, such as a television, a notebook computer, a monitor, a billboard, the Internet of things (IoT), or the like. Alternatively, the display device 1 may be a wearable device, such as a smart watch, a watch phone, a glasses type display, a head mounted display (HMD), or the like. Alternatively, the display device 1 may be a part of another device. In an embodiment, for example, the display device 1 may be a display of a certain electronic device. Alternatively, the display device 1 may be used as a display for an instrument panel of a vehicle, a center information display (CID) disposed in the center fascia or dashboard of a vehicle, a room mirror display in lieu of a side mirror of a vehicle, or a display screen disposed at the rear surface of a front seat as an entertainment device for a rear seat of a vehicle.

In an embodiment, the display device 1 may have a long side in a first direction and a short side in a second direction. The first direction and the second direction may intersect each other. In an embodiment, for example, the first direction and the second direction may form an acute angle therebetween. In an alternative embodiment, for example, the first direction and the second direction may form an obtuse angle therebetween or a right angle with each other. Hereinafter, for convenience of description, embodiments in which the first direction (e.g., a y direction or a −y direction) and the second direction (e.g., an x direction and a −x direction) form a right angle will be mainly described in detail.

In an alternative embodiment, in the display device 1, the length of a side in the first direction (e.g., the y direction or the −y direction) may be the same as the length of a side in the second direction (e.g., the x direction or the −x direction). In another alternative embodiment, the display device 1 may have a short side in the first direction (e.g., the y direction or the −y direction) and a long side in the second direction (e.g., the x direction or the −x direction).

A corner where the long side in the first direction (e.g., the y direction or the −y direction) meets the short lie in the second direction (e.g., the x direction or the −x direction) may bent at a certain curvature.

The display panel 10 may include a substrate 100 and a plurality of pixels PX. The substrate 100 or the display panel 10 including the substrate 100, as illustrated in FIG. 1A, may include a display area DA for displaying an image and a peripheral area PA surrounding the display area DA. The pixels PX may be arranged in the display area DA, and an image may be displayed through the pixels PX. Each of the pixels PX may include sub-pixels. In an embodiment, for example, each of the pixels PX may include a red sub-pixel, a green sub-pixel, and a blue sub-pixel. Alternatively, each of the pixels PX may include a red sub-pixel, a green sub-pixel, a blue sub-pixel, and a white sub-pixel.

The display area DA may include a front display area FDA, a side display area SDA, and a corner display area CDA. The pixels PX arranged in each display area DA may display an image. In an embodiment, the pixels PX of each of the front display area FDA, the side display area SDA, and the corner display area CDA may provide independent images. In an alternative embodiment, the pixels PX of each of the front display area FDA, the side display area SDA, and the corner display area CDA may provide portions of any one image.

The front display area FDA is a flat display area, and pixels PX each including a display element may be arranged therein. In an embodiment, the front display area FDA may provide most of an image.

The pixels PX each including a display element may be arranged in the side display area SDA. Accordingly, the side display area SDA may display an image. The side display area SDA may be arranged at a side of the front display area FDA between corners (or corner areas) CN. In an embodiment, the side display area SDA may include a first side display area SDA1, a second side display area SDA2, a third side display area SDA3, and a fourth side display area SDA4. In some embodiments, at least one of the first side display area SDA1, the second side display area SDA2, the third side display area SDA3, and the fourth side display area SDA4 may be omitted.

The first side display area SDA1 and the third side display area SDA3 may be connected to the front display area FDA in the first direction (e.g., they direction or the −y direction). In an embodiment, for example, the first side display area SDA1 may be connected to the front display area FDA in the −y direction, and the third side display area SDA3 may be connected to the front display area FDA in the y direction.

The first side display area SDA1 and the third side display area SDA3 may each be bent at a radius of curvature. In an embodiment, the first side display area SDA1 and the third side display area SDA3 may have different radii of curvature. In an alternative embodiment, the first side display area SDA1 and the third side display area SDA3 may have a same radius of curvature as each other. Hereinafter, for convenience of description, embodiments in which the first side display area SDA1 and the third side display area SDA3 have the same radius of curvature as a second radius of curvature R2 (see FIG. 4B) will be mainly described in detail. Furthermore, as the first side display area SDA1 and the third side display area SDA3 are the same as or similar to each other, the first side display area SDA1 is mainly described in detail.

The second side display area SDA2 and the fourth side display area SDA4 may be connected to the front display area FDA in the second direction (e.g., the x direction or the −x direction). In an embodiment, for example, the second side display area SDA2 may be connected to the front display area FDA in the −x direction, and the fourth side display area SDA4 may be connected to the front display area FDA in the x direction.

The second side display area SDA2 and the fourth side display area SDA4 may each be bent at a radius of curvature. In an embodiment, the second side display area SDA2 and the fourth side display area SDA4 may have different radii of curvature. In an alternative embodiment, the second side display area SDA2 and the fourth side display area SDA4 may have a same radius of curvature as each other. Hereinafter, for convenience of description, embodiments in which the second side display area SDA2 and the fourth side display area SDA4 have the same radius of curvature of a third radius of curvature R3 (see FIG. 4C) will be mainly described in detail. Furthermore, as the second side display area SDA2 and the fourth side display area SDA4 are the same as or similar to each other, the second side display area SDA2 is mainly described in detail.

In an embodiment, the second radius of curvature R2 of the first side display area SDA1 may be different from the third radius of curvature R3 of the second side display area SDA2. In an embodiment, for example, the second radius of curvature R2 may be greater than the third radius of curvature R3. In an alternative embodiment, for example, the second radius of curvature R2 may be less than the third radius of curvature R3. In another alternative embodiment, the second radius of curvature R2 of the first side display area SDA1 may be the same as the third radius of curvature R3 of the second side display area SDA2. Hereinafter, for convenience of description, embodiments in which the second radius of curvature R2 is greater than the third radius of curvature R3 will be mainly described in detail.

The corner display area CDA may be arranged in the corner (or corner area) CN of the display panel 10 to be bent. In such an embodiment, the corner display area CDA may be arranged corresponding to the corner CN. The corner CN may be a portion where the long side of the display device 1 and/or the display panel 10 in the first direction (e.g., they direction or the −y direction) meets the short side of the display device 1 and/or the display panel 10 in the second direction (e.g., the x direction or the −x direction). The corner display area CDA may be arranged between the side display areas SDA neighboring each other. In an embodiment, for example, the corner display area CDA may be arranged between the first side display area SDA1 and the second side display area SDA2. Alternatively, the corner display area CDA may be arranged between the second side display area SDA2 and the third side display area SDA3, between the third side display area SDA3 and the fourth side display area SDA4, or between the fourth side display area SDA4 and the first side display area SDA1. Accordingly, the side display area SDA and the corner display area CDA may each be bent by at least partially surrounding the front display area FDA.

The pixels PX each including a display element may be arranged in the corner display area CDA. Accordingly, the corner display area CDA may display an image.

In an embodiment where the second radius of curvature R2 of the first side display area SDA1 is different from the third radius of curvature R3 of the second side display area SDA2, a radius of curvature in the corner display area CDA may be gradually changed. In an embodiment, when the second radius of curvature R2 of the first side display area SDA1 is greater than the third radius of curvature R3 of the second side display area SDA2, the radius of curvature of the corner display area CDA may be gradually decreased in a direction from the first side display area SDA1 toward the second side display area SDA2. In an embodiment, for example, a first radius of curvature R1 (see FIG. 4A) of the corner display area CDA may be less than the second radius of curvature R2 and greater than the third radius of curvature R3.

The display device 1 may display an image not only in the front display area FDA, but also in the side display area SDA and the corner display area CDA. Accordingly, the share of the display area DA in the display device 1 may be increased. Furthermore, the display device 1 may be bent in the corner CN and may include the corner display area CDA for displaying an image, thereby improving aesthetic appeal.

In an embodiment, the peripheral area PA may include a first peripheral area PA1 and a second peripheral area PA2. The first peripheral area PA1 may be arranged in the corner CN and outside the corner display area CDA. The second peripheral area PA2 may be arranged outside the side display area SDA.

In an embodiment, the second peripheral area PA2 may be arranged outside each of the first to fourth side display areas SDA1, SDA2, SDA3, and SDA4. In an embodiment, for example, the second peripheral area PA2 may include a portion extending in the first direction (e.g., the y direction or the −y direction) and a portion extending in the second direction (e.g., the x direction or the −x direction). In such an embodiment, the second peripheral area PA2 may include a portion extending in the first direction and arranged outside each of the first side display area SDA1 and the third side display area SDA3 and a portion extending in the second direction and arranged outside each of the second side display area SDA2 and the fourth side display area SDA4.

In an embodiment, the first peripheral area PA1 may be arranged between a portion of the second peripheral area PA2 extending in the first direction (e.g., the y direction or the −y direction) and a portion of the second peripheral area PA2 extending in the second direction (e.g., the x direction or the −x direction).

In an embodiment, the display panel 10, as illustrated in FIG. 1B, may be disposed under the cover window CW. Although not illustrated, the display panel 10 may be attached to the cover window CW via a transparent adhesive member such as an optically clear adhesive (OCA) film.

The cover window CW may be a flexible window. The cover window CW may be easily bent according to an external force without generating cracks and the like, thereby protecting the display panel 10. The cover window CW may include glass, sapphire, or plastic. The cover window CW may be, for example, tempered glass (ultra-thin glass, UTG), or transparent polyimide (colorless polyimide, CPI). In an embodiment, the cover window CW may have a structure in which a polymer layer having flexibility is disposed on one surface of a glass substrate, or may be configured with only a polymer layer.

In an embodiment, the cover window CW may include, as illustrated in FIG. 2, a flat area FA having a flat surface and a curved area BA having a curved shape. The flat area FA may overlap the front display area FDA of the display panel 10. The curved area BA may overlap the side display area SDA, the corner display area CDA, and the peripheral area PA of the display panel 10.

The curved area BA may be bent by at least partially surrounding the flat area FA. In an embodiment, the curved area BA may include a first curved area BA1, a second curved area BA2, a third curved area BA3, and a fourth curved area BA4.

The first curved area BA1 and the second curved area BA2 may be arranged in the corner CN of the cover window CW to be bent. The corner CN may be a portion where the long side of the display device 1 and/or the cover window CW in the first direction (e.g., the y direction or the −y direction) meets the short side of the display device 1 and/or the display panel 10 in the second direction (e.g., the x direction or the −x direction).

The first curved area BA1 may overlap the corner display area CDA of the display panel 10. The first curved area BA1 may be arranged between the third curved areas BA3 neighboring each other.

The second curved area BA2 may be a portion extending from the first curved area BA1. The second curved area BA2 may overlap the first peripheral area PA1 of the display panel 10. The second curved area BA2 may be arranged between the fourth curved areas BA4 neighboring each other.

The third curved area BA3 may overlap the side display area SDA of the display panel 10. In an embodiment, for example, the third curved area BA3 may overlap the first to fourth side display areas SDA1, SDA2, SDA3, and SDA4 of the display panel 10. The third curved area BA3 may be bent at a radius of curvature. The third curved area BA3 may include a portion extending in the first direction (e.g., the y direction or the −y direction) and a portion extending in the second direction (e.g., the x direction or the −x direction). In such an embodiment, the third curved area BA3 may include a portion extending in the first direction and overlapping the first side display area SDA1 and the third side display area SDA3, and a portion extending in the second direction and overlapping the second side display area SDA2 and the fourth side display area SDA4. In an embodiment, the first curved area BA1 may be arranged between a portion of the third curved area BA3 extending in the first direction and a portion of the third curved area BA3 extending in the second direction.

The fourth curved area BA4 may be an area extending from the third curved area BA3. The fourth curved area BA4 may overlap the second peripheral area PA2 of the display panel 10. The fourth curved area BA4 may include a portion extending in the first direction (e.g., they direction or the −y direction) and a portion extending in the second direction (e.g., the x direction or the −x direction). In an embodiment, the second curved area BA2 may be arranged between a portion of the fourth curved area BA4 extending in the first direction and a portion of the fourth curved area BA4 extending in the second direction.

In a cross-sectional view, the second curved area BA2 may have a thickness less than a thickness of the first curved area BA1. In such an embodiment, in the corner CN, a portion of the cover window CW overlapping the first peripheral area PA1 may have a thickness less than a thickness of a portion of the cover window CW overlapping the display area DA. In an embodiment, in a cross-sectional view, the fourth curved area BA4 may have substantially a same thickness as the third curved area BA3, but the disclosure is not limited thereto. In an alternative embodiment, in a cross-sectional view, the fourth curved area BA4 may have a thickness less than a thickness of the third curved area BA3.

The shapes of the first to fourth curved areas BA1, BA2, BA3, and BA4 in a cross-sectional view will described later in greater detail.

Figure 3:
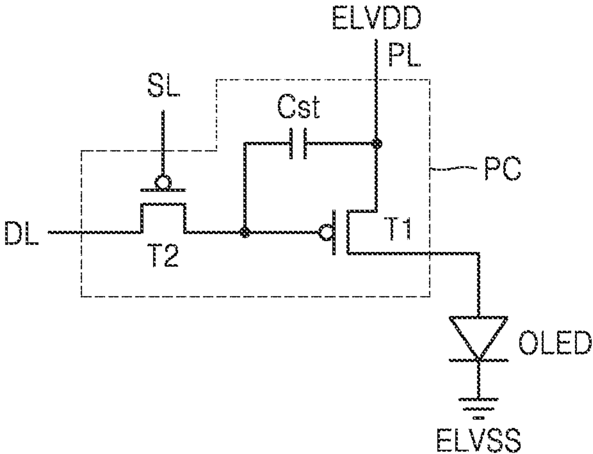
FIG. 3 is an equivalent circuit diagram of a pixel circuit included in a display device according to an embodiment.

FIG. 3 is an equivalent circuit diagram of a pixel circuit included in a display device according to an embodiment.

Referring to FIG. 3, an embodiment of a pixel circuit PC may be connected to a display element, for example, an organic light-emitting diode OLED.

The pixel circuit PC may include a driving thin film transistor T1, a switching thin film transistor T2, and a storage capacitor Cst. The organic light-emitting diode OLED may emit red, green, or blue light, or red, green, blue or white light.

The switching thin film transistor T2 may be connected to a scan line SL and a data line DL, and may transmit a data signal or a data voltage input from the data line DL to the driving thin film transistor T1 based on a scan signal or a switching voltage input from the scan signal SL. The storage capacitor Cst may be connected to the switching thin film transistor T2 and a driving voltage line PL, and may store a voltage corresponding to a difference between a voltage received from the switching thin film transistor T2 and a first power voltage ELVDD transmitted to the driving voltage line PL.

The driving thin film transistor T1 may be connected to the driving voltage line PL and the storage capacitor Cst, and may control a driving current flowing in the organic light-emitting diode OLED from the driving voltage line PL corresponding to a voltage value stored in the storage capacitor Cst. The organic light-emitting diode OLED may emit light having a certain luminance corresponding to the driving current. A counter electrode of the organic light-emitting diode OLED may receive a second power voltage ELVSS.

Although FIG. 3 illustrates an embodiment where the pixel circuit PC includes two thin film transistors and one storage capacitor, in an alternative embodiment, the pixel circuit PC may include three, four, five or more thin film transistors.

Figure 4A:
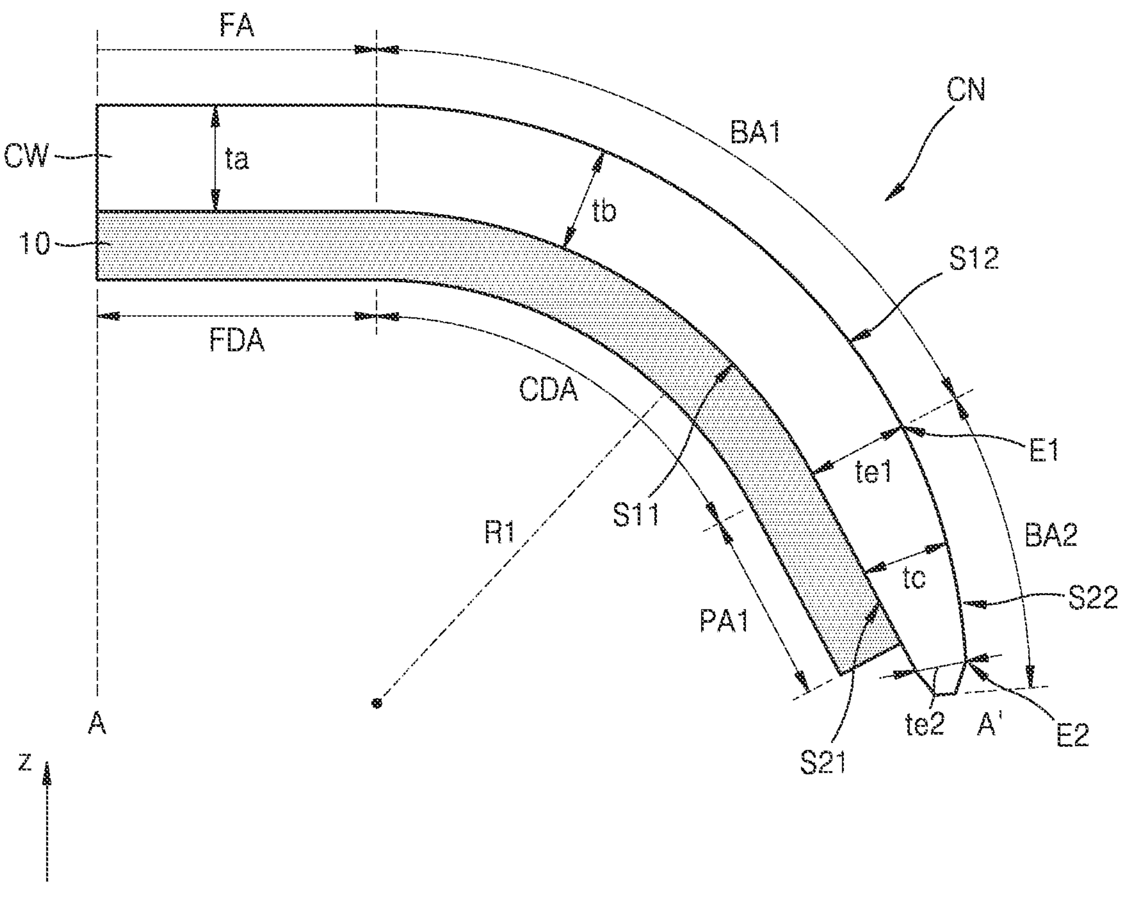
FIG. 4A is a schematic cross-sectional view of the display device of FIG. 1A taken along line A-A' of FIG. 1A.
Figure 4B:
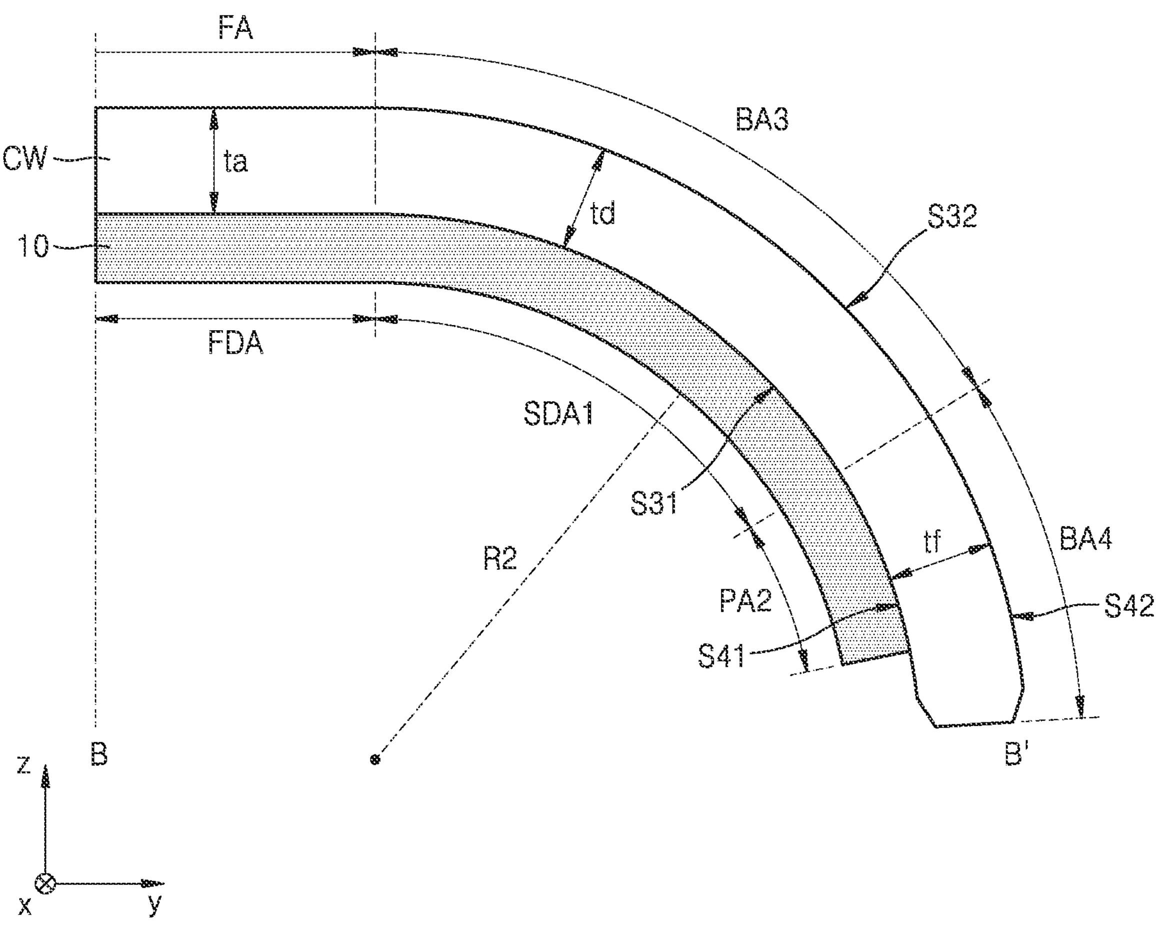
FIG. 4B is a schematic cross-sectional view of the display device of FIG. 1A taken along line B-B' of FIG. 1A.
Figure 4C:
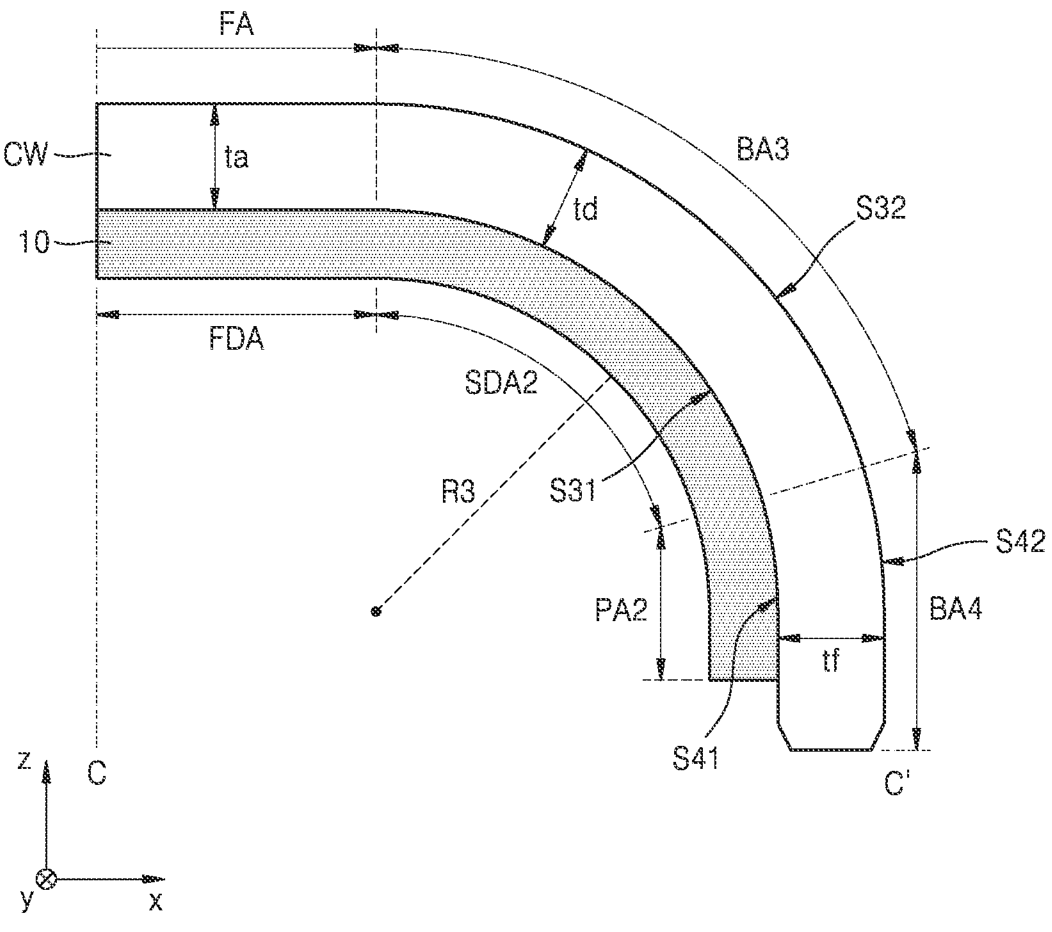
FIG. 4C is a schematic cross-sectional view of the display device of FIG. 1A taken along line C-C' of FIG. 1A.

FIG. 4A is a schematic cross-sectional view of the display device 1 of FIG. 1A taken along line A-A' of FIG. 1A. FIG. 4B is a schematic cross-sectional view of the display device 1 of FIG. 1A taken along line B-B' of FIG. 1A. FIG. 4C is a schematic cross-sectional view of the display device 1 of FIG. 1A taken along line C-C' of FIG. 1A.

Referring to FIG. 4A, an embodiment of the cover window CW may include the second curved area BA2 having a thickness less than a thickness of the first curved area BA1 in the corner CN.

The thickness of the first curved area BA1 may be substantially uniform or constant. A thickness tb of the first curved area BA1 may be substantially the same as a thickness to of the flat area FA. The thickness tb of first curved area BA1 may be greater than a thickness tc of the second curved area BA2.

In the specification, the thickness tc of the second curved area BA2 may be defined as a range of the thickness of the second curved area BA2 or an average thickness of the second curved area BA2.

The thickness tc of the second curved area BA2 may be less than the thickness tb of the first curved area BA1. In an embodiment, the thickness tc of the second curved area BA2 may decrease as being away from the first curved area BA1. In an embodiment, the second curved area BA2 may have a shape in which the thickness gradually decreases as being away from the first curved area BA1, but the disclosure is not limited thereto. In an alternative embodiment, the thickness of the second curved area BA2 may gradually decrease as being away from the first curved area BA1, but may include a discontinuous surface such as a step shape and the like.

A first surface S21 of the second curved area BA2, the first surface S21 adjacent to the display panel 10, may be a flat surface or a curved surface, but the disclosure is not limited thereto. In an embodiment, for example, the first surface S21 of the second curved area BA2 may be deformed in various shapes such as a step shape and the like. A second surface S22 opposite to the first surface S21 of the second curved area BA2 may be a curved surface having a radius of curvature.

The first surface S21 of the second curved area BA2 may have a shape different from a shape of a first surface S11 of the first curved area BA1, the first surface S11 adjacent to the display panel 10. In an embodiment, for example, where the first surface S21 of the second curved area BA2 is a curved surface, the first surface S21 may have a radius of curvature different from a radius of curvature of the first surface S11 of the first curved area BA1. In an embodiment, for example, where the first surface S21 of the second curved area BA2 is a flat surface, the first surface S11 of the first curved area BA1 may have a curved surface. In an embodiment, the second surface S22 of the second curved area BA2 may have substantially the same shape as a second surface S12 opposite to the first surface S11 of the first curved area BA1. In an embodiment, for example, the second surface S22 of the second curved area BA2 may have substantially the same radius of curvature as the second surface S12 of the first curved area BA1, but the disclosure is not limited thereto.

The second curved area BA2 may include a first end portion E1 in contact with the first curved area BA1 and a second end portion E2 opposite to the first end portion E1. The second end portion E2 may be defined as a region including a point where the thickness of the second curved area BA2 discontinuously decreases as being away from the front display area FDA. The second end portion E2 is illustrated as having a trapezoidal shape in which the thickness gradually decreases with increasing distance from the front display area FDA, but the disclosure is not limited thereto. A thickness te1 of the first end portion E1 of the second curved area BA2 may be substantially the same as or less than the thickness tb of the first curved area BA1. A thickness te2 of the second end portion E2 of the second curved area BA2 may be less than the thickness tb of the first curved area BA1. The thickness te2 of the second end portion E2 of the second curved area BA2 may be less than the thickness te1 of the first end portion E1 of the second curved area BA2. In the specification, the thickness te2 of the second end portion E2 of the second curved area BA2 may be defined as the maximum thickness in the second end portion E2.

In an embodiment, the thickness te2 of the second end portion E2 of the second curved area BA2 may be in a range of about 60% to about 90% of the thickness tb of the first curved area BA1. In an embodiment, for example, where the thickness tb of the first curved area BA1 is about 500 μm, the thickness te2 of the second end portion E2 of the second curved area BA2 may be greater than or equal to about 300 μm and less than or equal to about 450 μm. If the thickness te2 of the second end portion E2 of the second curved area BA2 is greater than the above range (i.e., greater than about 90% of the thickness of the first curved areaBA1), the buckling of the corner display area CDA may occur during a process of attaching the cover window CW to the display panel 10. If the thickness te2 of the second end portion E2 of the second curved area BA2 is less than the above range (i.e., less than about 60% of the thickness of the first curved areaBA1), strength decreases so that the occurrence of scratch or damage may be increased.

As the second curved area BA2 overlapping the first peripheral area PA1 of the display panel 10 has a shape in which the thickness gradually decreases, in the attaching of the cover window CW to the display panel 10 as will be described later with reference to FIGS. 15A to 15C, the occurrence of bucking in the corner display area CDA of the display panel 10 may be effectively prevented or substantially reduced.

Referring to FIGS. 4B and 4C, the cover window CW may include, in an area other than the corner CN, the third curved area BA3 and the fourth curved area BA4 having substantially a same thickness as each other.

A thickness td of the third curved area BA3 may be substantially uniform or constant. The thickness td of the third curved area BA3 may be substantially the same as the thickness to of the flat area FA. In an embodiment, the thickness td of the third curved area BA3 may be substantially the same as a thickness tf of the fourth curved area BA4. In an embodiment, the thickness if of the fourth curved area BA4 may be substantially uniform. In an embodiment, the cover window CW may have substantially the same thickness in the curved areas BA, except the second curved area BA2 arranged in the corner, and the flat area FA.

In an embodiment, the second curved area BA2 of the cover window CW is provided to have a relatively thin structure, the buckling of the display panel 10 that may occur during a process of attaching the cover window CW to the display panel 10 may be effectively prevented, and scratch or damage risk of the display device may be substantially reduced.

In the specification, the thickness tf of the fourth curved area BA4 may be defined as a range of the thickness of the fourth curved area BA4 or an average thickness of the fourth curved area BA4.

At least part of a first surface S41 of the fourth curved area BA4, the first surface S41 adjacent to the display panel 10, may be a curved surface having a radius of curvature. At least part of a second surface S42 of the fourth curved area BA4, which is opposite to the first surface S41, may be a curved surface having a radius of curvature. In an embodiment, the first surface S41 of the fourth curved area BA4 may have substantially the same radius of curvature as a first surface S31 of the third curved area BA3, the first surface S31 adjacent to the display panel 10, but the disclosure is not limited thereto. In an embodiment, the second surface S42 of the fourth curved area BA4 may have substantially the same radius of curvature as a second surface S32 opposite to the first surface S31 of the third curved area BA3, but the disclosure is not limited thereto.

In the following description, any repetitive detailed descriptions on the same or like constituent element labeled with the same reference numerals as those described with reference to FIGS. 1 to 4C will be omitted, and only different elements will be mainly described.

Figure 5A:
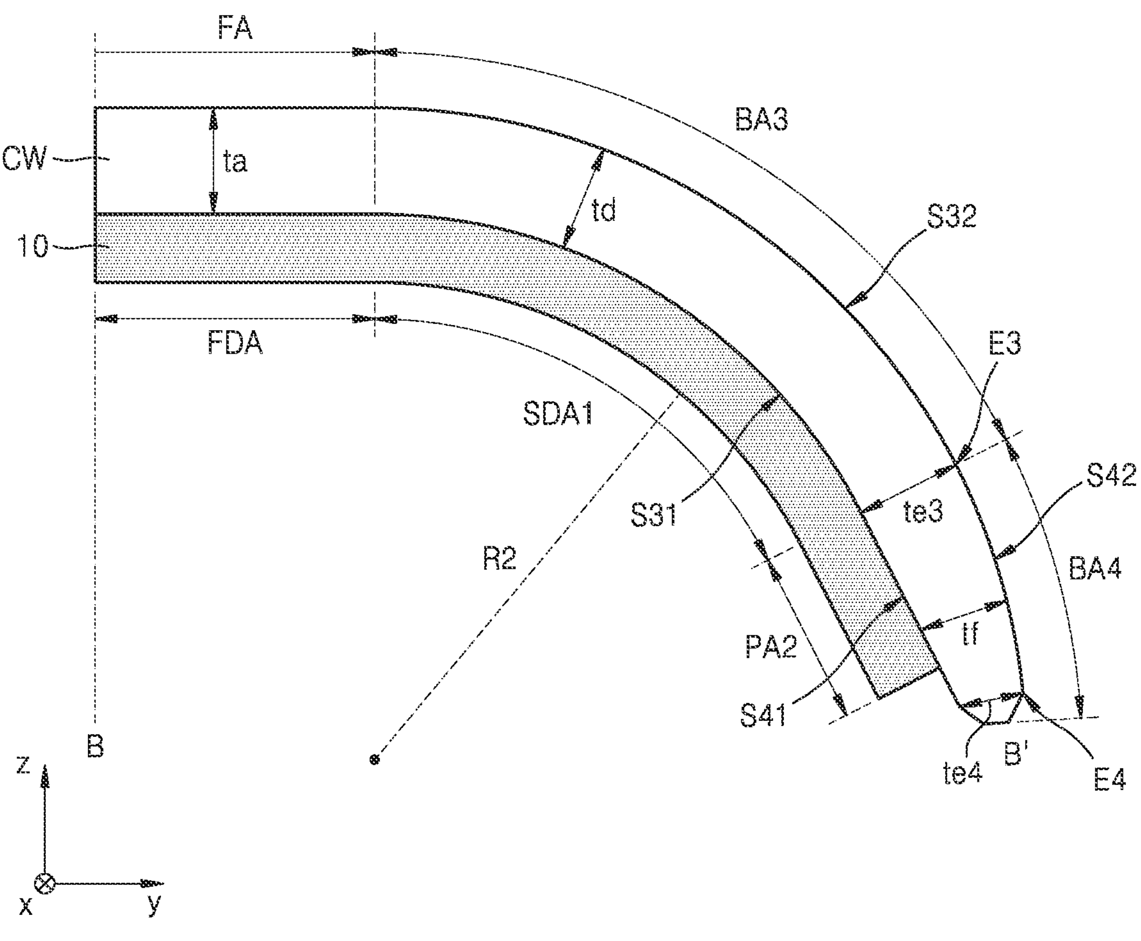
FIG. 5A is a schematic cross-sectional view of a display device according to an alternative embodiment corresponding to FIG. 4B.
Figure 5B:
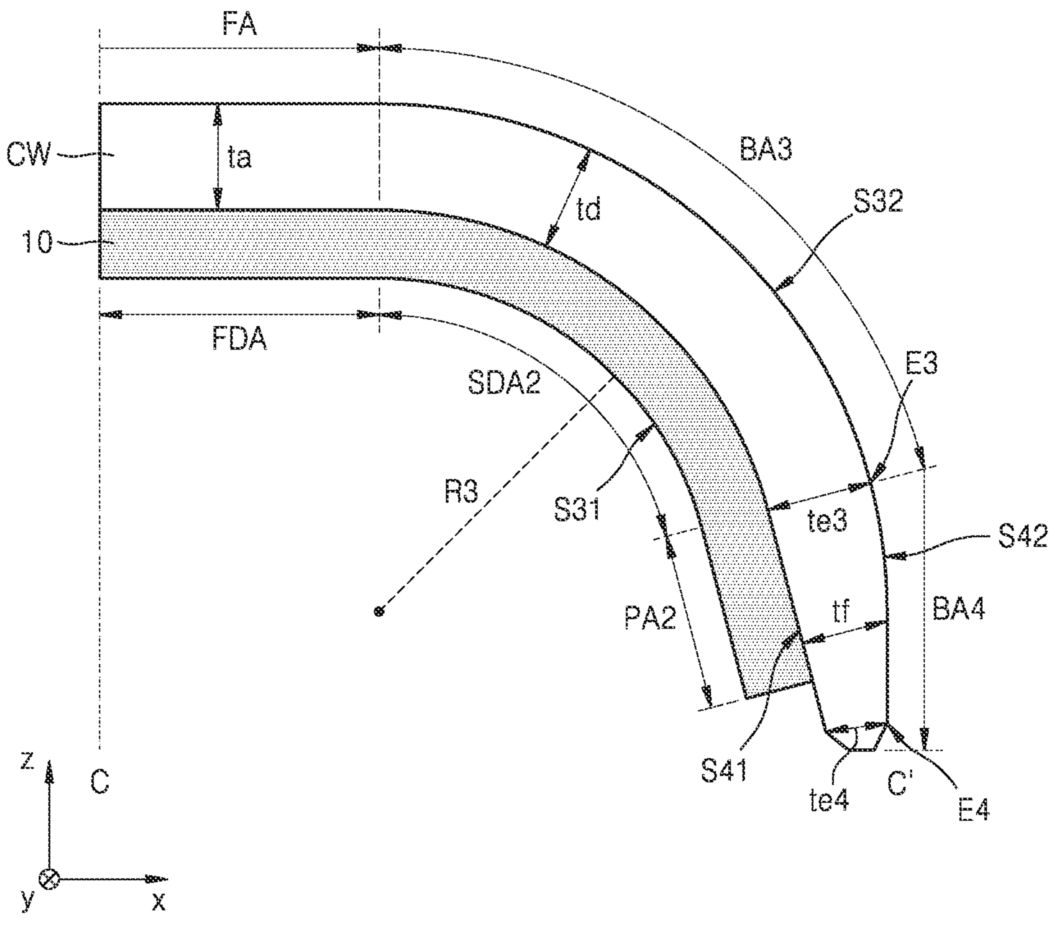
FIG. 5B is a schematic cross-sectional view of a display device according to an alternative embodiment corresponding to FIG. 4C.

FIG. 5A is a schematic cross-sectional view of the display device 1 according to an alternative embodiment corresponding to FIG. 4B. FIG. 5B is a schematic cross-sectional view of the display device 1 according to an alternative embodiment corresponding to FIG. 4C.

Referring to FIGS. 5A and 5B, an embodiment of the cover window CW may have a thickness less than a thickness of the curved area BA overlapping the display area DA (see FIG. 1A) in the curved area BA (see FIG. 2) overlapping the peripheral area PA (see FIG. 1A) of the display panel 10. In an embodiment, for example, as illustrated in FIG. 4A, the cover window CW may have a thickness less than a thickness of the first curved area BA1 overlapping the corner display area CDA in the second curved area BA2 overlapping the first peripheral area PA1. In an embodiment, for example, as illustrated in FIGS. 5A and 5B, the cover window CW may have a thickness less than a thickness of the third curved area BA3 overlapping the side display areas SDA1 and SDA2 in the fourth curved area BA4 overlapping the second peripheral area PA2.

The thickness of the third curved area BA3 may be substantially uniform or constant. The thickness td of the third curved area BA3 may be substantially the same as the thickness to of the flat area FA. In an embodiment, the thickness td of the third curved area BA3 may be greater than the thickness tf of the fourth curved area BA4.

In an embodiment, the thickness tf of the fourth curved area BA4 may be less than the thickness td of the third curved area BA3. In an embodiment, the thickness tf the fourth curved area BA4 may decrease as being away from the third curved area BA3. In an embodiment, the fourth curved area BA4 may have a shape in which the thickness gradually decreases as being away from the third curved area BA3, but the disclosure is not limited thereto. In an alternative embodiment, the fourth curved area BA4 becomes thinner as being away from the third curved area BA3, but may include a discontinuous surface such as a step shape and the like.

The first surface S41 of the fourth curved area BA4, the first surface S41 adjacent to the display panel 10, may be a flat surface or a curved surface, but the disclosure is not limited thereto. In an embodiment, for example, the first surface S41 of the fourth curved area BA4 may be deformed in various shapes such as a step shape and the like. The second surface S42 of the fourth curved area BA4, which is opposite to the first surface S41, may be a curved surface having a radius of curvature.

The first surface S41 of the fourth curved area BA4 may have a shape different from a shape of the first surface S31 of the third curved area BA3, the first surface S31 adjacent to the display panel 10. In an embodiment, for example, when the first surface S41 of the fourth curved area BA4 is a curved surface, the first surface S41 may have a radius of curvature different from the radius of curvature of the first surface S31 of the third curved area BA3. In an embodiment, for example, the first surface S41 of the fourth curved area BA4 may have a flat surface, and the first surface S31 of the third curved area BA3 may have a curved surface. In an embodiment, the second surface S42 of the fourth curved area BA4 may have substantially the same shape as the second surface S32 opposite to the first surface S31 of the third curved area BA3. In an embodiment, for example, the second surface S42 of the fourth curved area BA4 may have substantially the same radius of curvature as the second surface S32 of the third curved area BA3, but the disclosure is not limited thereto.

The fourth curved area BA4 may include a third end portion E3 in contact with the third curved area BA3 and a fourth end portion E4 opposite to the third end portion E3. The third end portion E3 may be defined as a region including a point where the thickness of the fourth curved area BA4 discontinuously decreases as being away from the front display area FDA. The fourth end portion E4 is illustrated as having a trapezoidal shape in which the thickness gradually decreases as being away from the front display area FDA, but the disclosure is not limited thereto. A thickness te3 of the third end portion E3 of the fourth curved area BA4 may be substantially the same as or less than the thickness td of the third curved area BA3. A thickness te4 of the fourth end portion E4 of the fourth curved area BA4 may be less than the thickness td of the third curved area BA3. The thickness te4 of the fourth end portion E4 of the fourth curved area BA4 may be less than the thickness te3 of the third end portion E3 of the fourth curved area BA4. In the specification, the thickness te4 of the fourth end portion E4 of the fourth curved area BA4 may be defined as the maximum thickness in the fourth end portion E4.

In an embodiment, the thickness tf of the fourth curved area BA4 may be substantially the same as the thickness tc of the second curved area BA2 described above with reference to FIG. 4A. In an embodiment, for example, the thickness te4 of the fourth end portion E4 of the fourth curved area BA4 may be in a range of about 60% to about 90% of the thickness td of the third curved area BA3. As the thickness tf of the fourth curved area BA4 is formed to be substantially the same as the second curved area BA2, process difficulty may be reduced.

Figure 6:
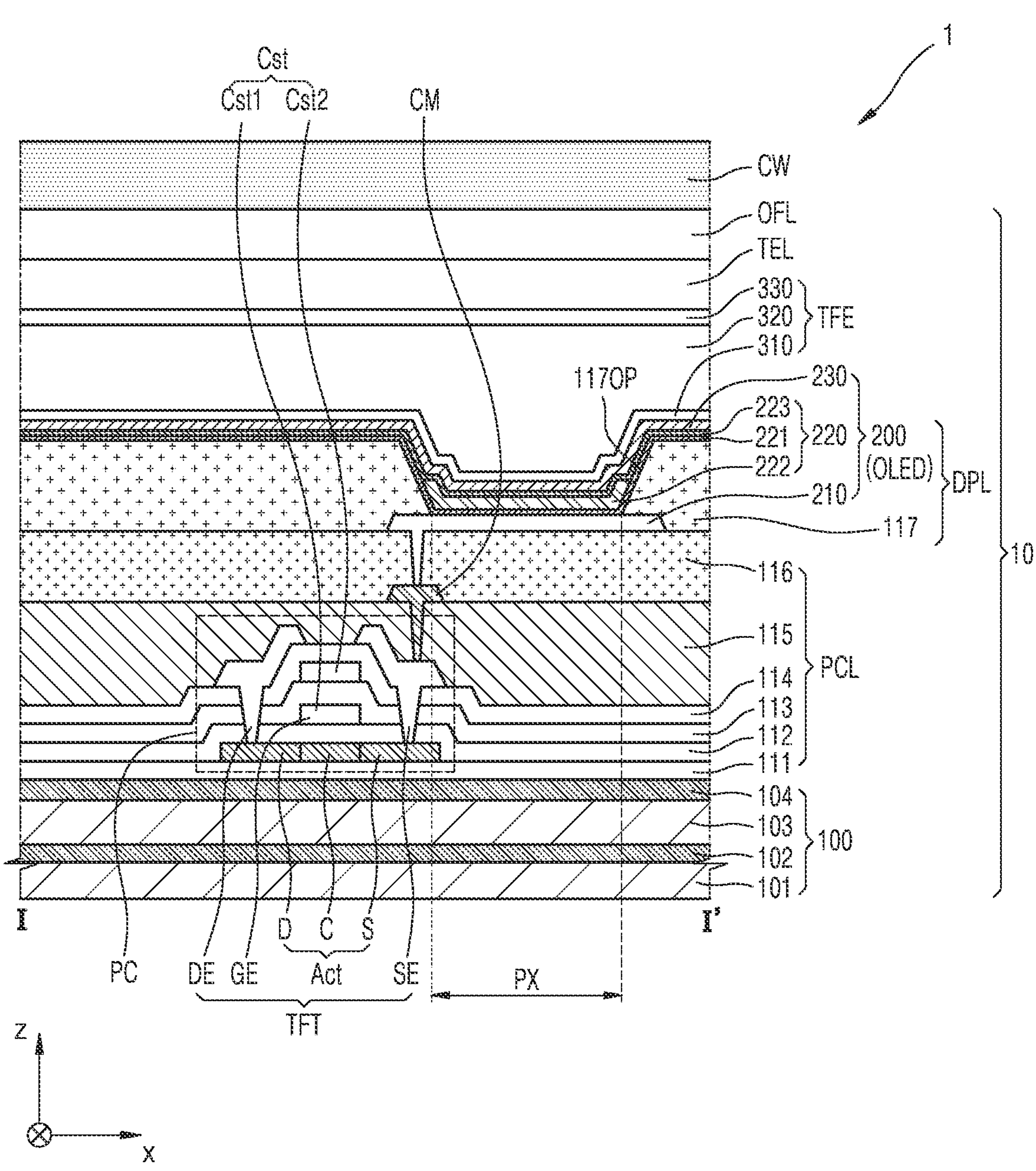
FIG. 6 is a schematic cross-sectional view of the display device of FIG. 1A taken along line I-I' of FIG. 1A.

FIG. 6 is a schematic cross-sectional view of the display device 1 of an embodiment taken along line I-I' of FIG. 1A.

Referring to FIG. 6, an embodiment of the display device 1 may include the display panel 10 and the cover window CW. The display panel 10 may have a stack structure of the substrate 100, a pixel circuit layer PCL, a display layer DPL, a thin film encapsulation layer TFE, a touch electrode layer TEL, and an optical functional layer OFL.

The substrate 100 may have a multilayer structure including a base layer including polymer resin and an inorganic layer. In an embodiment, for example, the substrate 100 may include a base layer including polymer resin and a barrier layer which is an inorganic insulating layer. In an embodiment, for example, the substrate 100 may include a first base layer 101, a first barrier layer 102, a second base layer 103, and a second barrier layer 104, which are sequentially stacked. Each of the first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate (PC), cellulose triacetate (TAC), cellulose acetate propionate (CAP), or/and the like. Each of the first barrier layer 102 and the second barrier layer 104 may include an inorganic insulating material, such as a silicon oxide, a silicon oxynitride, a silicon nitride, or the like. In an embodiment, the substrate 100 may be flexible.

The pixel circuit layer PCL is disposed on the substrate 100. The pixel circuit layer PCL may include the pixel circuit PC including a thin film transistor TFT and the storage capacitor Cst. In an embodiment, the pixel circuit layer PCL may include a buffer layer 111, a first gate insulating layer 112, a second gate insulating layer 113, an interlayer insulating layer 114, a first planarization insulating layer 115, and a second planarization insulating layer 116, which are disposed below or/and above the constituent elements of the pixel circuit PC.

The buffer layer 111 may reduce or block infiltration of foreign materials, moisture, or external air from under the substrate 100, and may provide a planarized surface on the substrate 100. The buffer layer 111 may include an inorganic insulating material, such as a silicon oxide, a silicon oxynitride, a silicon nitride, or the like, and may have a single layer or multilayer structure, each layer therein including at least one selected from the materials described above.

The thin film transistor TFT on the buffer layer 111 may include a semiconductor layer Act, and the semiconductor layer Act may include polysilicon. Alternatively, the semiconductor layer Act may include amorphous silicon, an oxide semiconductor, an organic semiconductor, or the like. The semiconductor layer Act may include a channel region C, and a drain region D and a source region S arranged in opposite sides of the channel region C. A gate electrode GE may overlap the channel region C.

The gate electrode GE may include a low-resistance metal material. The gate electrode GE may include a conductive material including molybdenum (Mo), aluminum (Al), copper (Cu), titanium (Ti), or the like, and may be formed in (or defined by) a multilayer or single layer (i.e., have a multilayer structure or a single layer structure), each layer therein including at least one selected from the materials described above.

The first gate insulating layer 112 between the semiconductor layer Act and the gate electrode GE may include an inorganic insulating material, such as a silicon oxide ($SiO_2$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_2$), or the like.

The second gate insulating layer 113 may be provided to cover the gate electrode GE. The second gate insulating layer 113 may include an inorganic insulating material, such as $SiO_2$, $SiN_x$, SiON, $Al_2O_3$, $TiO_2$, $Ta_2O_5$, $HfO_2$, $ZnO_2$, or the like, similarly to the first gate insulating layer 112.

An upper electrode Cst2 of the storage capacitor Cst may be disposed above the second gate insulating layer 113. The upper electrode Cst2 may overlap the gate electrode GE thereunder. The gate electrode GE and the upper electrode Cst2 overlapping each other with the second gate insulating layer 113 therebetween may form or collectively define the storage capacitor Cst. In an embodiment, the gate electrode GE may function as a lower electrode Cst1 of the storage capacitor Cst.

In such an embodiment, the storage capacitor Cst and the thin film transistor TFT may overlap each other. In some embodiments, the storage capacitor Cst may not overlap the thin film transistor TFT.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be formed in a single layer or multilayer, each layer therein including at least one selected from the materials described above.

The interlayer insulating layer 114 may be disposed on the second gate insulating layer 113 to cover the upper electrode Cst2. The interlayer insulating layer 114 may include $SiO_2$, $SiN_x$, SiON, $Al_2O_3$, $TiO_2$, $Ta_2O_5$, $HfO_2$, $ZnO_2$, or the like. The interlayer insulating layer 114 may be formed in a single layer or multilayer, each layer therein including at least one selected from the inorganic insulating materials described above.

A drain electrode DE and a source electrode SE may each be disposed on the interlayer insulating layer 114. The drain electrode DE and the source electrode SE may be respectively connected to the drain region D and the source region S, through contact holes defined in insulating layers thereunder. The drain electrode DE and the source electrode SE may each include a material having high conductivity. The drain electrode DE and the source electrode SE may each include a conductive material including Mo, Al, Cu, Ti, or the like, and may be formed in a multilayer or single layer, each layer therein including at least one selected from the above materials. In an embodiment, the drain electrode DE and the source electrode SE may each have a multilayer structure of Ti/Al/Ti.

The first planarization insulating layer 115 may be disposed on the interlayer insulating layer 114 to cover the drain electrode DE and the source electrode SE. The first planarization insulating layer 115 may include an organic insulating material, such as general purpose polymers such as polymethylmethacrylate (PMMA) or polystyrene (PS), polymer derivatives having a phenolic group, acrylic polymers, imide-based polymers, aryl ether-based polymers, amide-based polymers, fluorine-based polymers, p-xylene-based polymers, vinyl alcohol-based polymers, or blends thereof.

The second planarization insulating layer 116 may be disposed on the first planarization insulating layer 115. The second planarization insulating layer 116 may include a same material as the first planarization insulating layer 115, and may include an organic insulating material, such as general purpose polymers such as polymethylmethacrylate (PMMA) or polystyrene (PS), polymer derivatives having a phenolic group, acrylic polymers, imide-based polymers, aryl ether-based polymers, amide-based polymers, fluorine-based polymers, p-xylene-based polymers, vinyl alcohol-based polymers, or blends thereof.

The display layer DPL may be disposed on the pixel circuit layer PCL having the structure described above. The display layer DPL, as a light-emitting element 200, may include an organic light-emitting diode (e.g., an organic light-emitting display OLED), and the organic light-emitting diode OLED may have a stack structure of a pixel electrode 210, an intermediate layer 220, and a counter electrode 230. The organic light-emitting diode OLED may emit, for example, red, green, or blue light, or red, green, blue, or white light. The organic light-emitting diode OLED emits light through a light-emitting area, and the light-emitting area may be defined as the pixel PX.

The pixel electrode 210 may be electrically connected to the thin film transistor TFT through contact holes defined or formed in the second planarization insulating layer 116 and the first planarization insulating layer 115 and a contact metal CM arranged on the first planarization insulating layer 115.

The pixel electrode 210 may include a conductive oxide, such as an indium tin oxide (ITO), an indium zinc oxide (IZO), a zinc oxide (ZnO), an indium oxide ($In_2O_3$), an indium gallium oxide (IGO), or an aluminum zinc oxide (AZO). In an alternative embodiment, the pixel electrode 210 may include a reflective film including Ag, Mg, Al, Pt, Pd, Au, Ni, Nd, Ir, Cr, or a compound thereof. In another alternative embodiment, the pixel electrode 210 may further include a film including or formed of ITO, IZO, ZnO, or $In_2O_3$ above/below the reflective film described above.

A pixel defining layer 117 provided with an opening 1170P for exposing a central portion of the pixel electrode 210 is disposed on the pixel electrode 210. The pixel defining layer 117 may include an organic insulating material and/or an inorganic insulating material. The opening 1170P may define a light-emitting area of the light emitted from the organic light-emitting diode OLED. In an embodiment, for example, the size/width of the opening 1170P may correspond to the size/width of the light-emitting area. Accordingly, the size and/or width of the pixel PX may depend on the size and/or width of the opening 1170P of the pixel defining layer 117 corresponding thereto.

The intermediate layer 220 may include a light-emitting layer 222 formed corresponding to the pixel electrode 210. The light-emitting layer 222 may include a polymer or a low-molecular weight organic material for emitting light of a certain color. Alternatively, the light-emitting layer 222 may include an inorganic light-emitting material or quantum dots.

A first functional layer 221 and a second functional layer 223 may be disposed respectively below and above the light-emitting layer 222. The first functional layer 221 may include, for example, a hole transport layer (HTL), or a hole transport layer and a hole injection layer (HIL). The second functional layer 223, as a constituent element disposed on the light-emitting layer 222, may include an electron transport layer (ETL) and/or an electron injection layer (EIL). The first functional layer 221 and/or the second functional layer 223, likewise the counter electrode 230 described below, may be a common layer formed to entirely cover the substrate 100.

The counter electrode 230 is disposed on the pixel electrode 210 and may overlap the pixel electrode 210. The counter electrode 230 may include a conductive material having a low work function. In an embodiment, for example, the counter electrode 230 may include a (semi-)transparent layer including Ag, Mg, Al, Pt, Pd, Au, Ni, Nd, Ir, Cr, lithium (Li), Ca, an alloy thereof, or the like. Alternatively, the counter electrode 230 may include a layer such as ITO, IZO, ZnO or $In_2O_3$, on a (semi-)transparent layer including at least one selected from the materials described above. The counter electrode 230 may be integrally formed as a single unitary part to entirely cover the substrate 100.

The display panel 10 may include a plurality of light-emitting elements 200, and the light-emitting elements 200 may emit light through the pixels PX, thereby providing an image. In an embodiment, the display area DA (see FIG. 1) may be defined by the light-emitting elements 200. Accordingly, the display panel 10 may include the display area DA defined by the light-emitting elements 200, and the display area DA of the display panel 10 may correspond to the display area DA of the substrate 100, as described above with reference to FIG. 1. In such an embodiment, the front display area FDA, the side display area SDA, and the corner display area CDA of the substrate 100 of FIG. 1 may be the front display area FDA, the side display area SDA, and the corner display area CDA of the display panel 10, respectively.

The thin film encapsulation layer TFE may be disposed on the display layer DPL and may cover the display layer DPL. The thin film encapsulation layer TFE may include at least one inorganic encapsulation layer and at least one organic encapsulation layer. In an embodiment, as illustrated in FIG. 6, the thin film encapsulation layer TFE includes a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may each include at least one inorganic material selected from an aluminum oxide, a titanium oxide, a tantalum oxide, a hafnium oxide, a zinc oxide, a silicon oxide, a silicon nitride, and a silicon oxynitride. The organic encapsulation layer 320 may include a polymer-based material. The polymer-based material may include acrylic resin, epoxy-based resin, polyimide, polyethylene, and the like. In an embodiment, the organic encapsulation layer 320 may include acrylate. The organic encapsulation layer 320 may be formed by curing a monomer, or applying a polymer. The organic encapsulation layer 320 may be transparent.

The touch electrode layer TEL including touch electrodes may be disposed on the thin film encapsulation layer TFE, and the optical functional layer OFL may be disposed on the touch electrode layer TEL. The touch electrode layer TEL may acquire coordinates information corresponding to an external input, for example, a touch event. The optical functional layer OFL may reduce reflectivity of light (e.g., external light) incident on the display device 1 from the outside, and/or improve color purity of the light emitted from the display device 1.

An adhesive member may be disposed between touch electrode layer TEL and the optical functional layer OFL. Any member generally known in the art may be employed as the adhesive member without limitation. The adhesive member may include a pressure sensitive adhesive (PSA) or a transparent adhesive (e.g., an optically clear adhesive (OCA)).

The cover window CW may be disposed on the display panel 10. The cover window CW may be attached on the display panel 10 by the adhesive member. The adhesive member may include, for example, a PSA or a transparent adhesive (e.g., OCA).

Although an embodiment where the display device 1 includes the organic light-emitting diode OLED as the light-emitting element 200 is described above, the display device 1 according to one or more embodiments is not limited thereto. In an alternative embodiment, the display device 1 may be a light-emitting display device (e.g., an inorganic light-emitting display or an inorganic electroluminescence (EL) display device) including an inorganic light-emitting diode. The inorganic light-emitting diode may include a PN junction diode including materials based on an inorganic semiconductor. When a voltage is applied to the PN junction diode in a forward direction, holes and electrons are injected, and energy is generated based on recombination of the holes and the electrons may be converted into light energy, thereby emitting light of a certain color. The inorganic light-emitting diode described above may have a width of several to several hundreds of micrometers. In some embodiments, the inorganic light-emitting diode may be referred to as a micro light-emitting diode (LED).

Figure 7A:
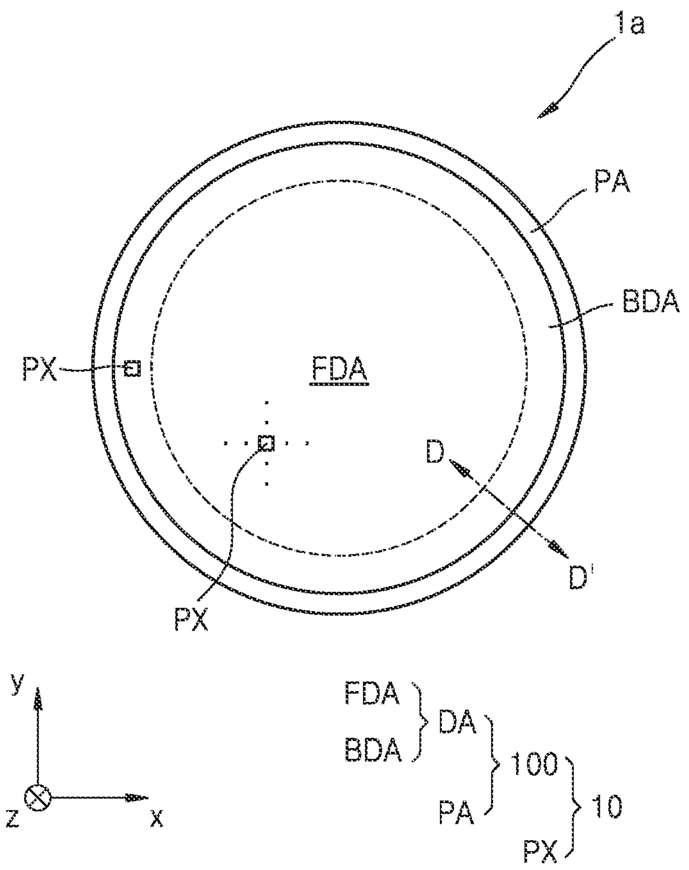
FIG. 7A is a schematic plan view of a display device according to an alternative embodiment.
Figure 7B:
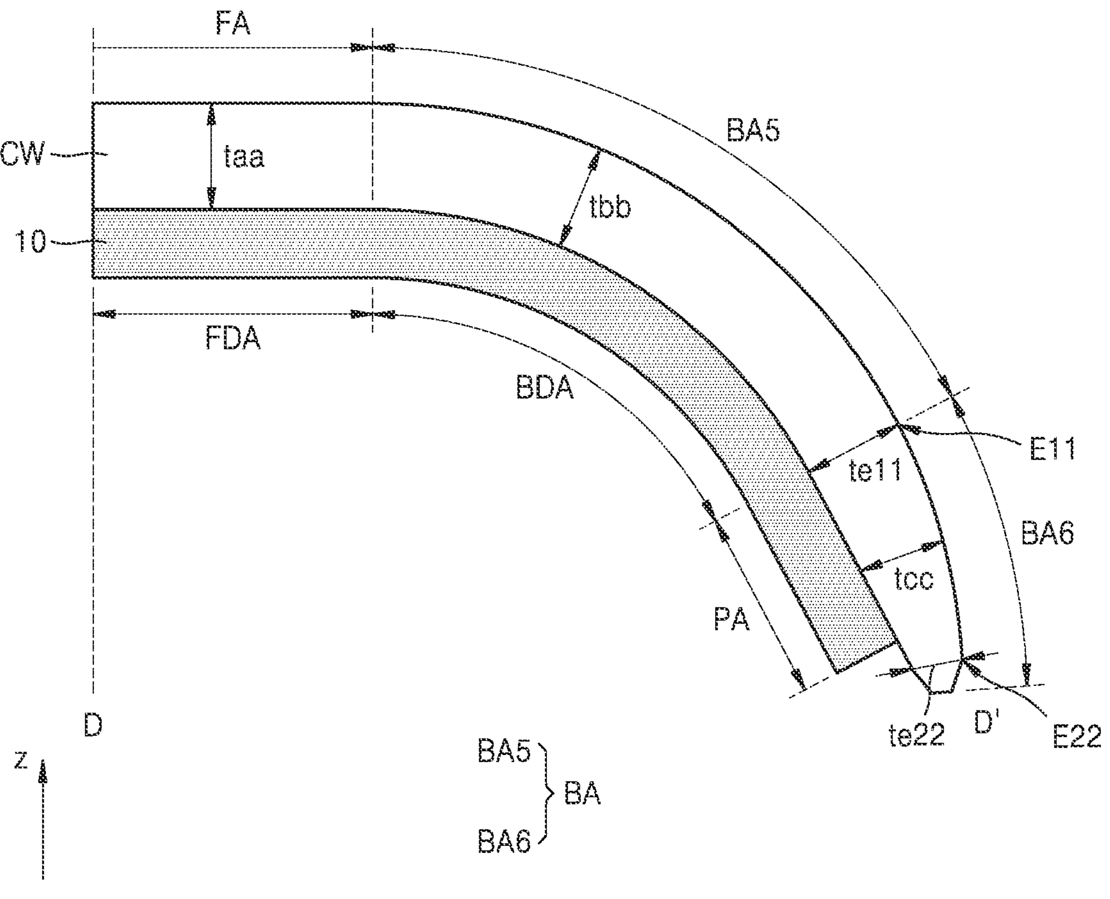
FIG. 7B is a schematic cross-sectional view of the display device of FIG. 7A taken along line D-D' of FIG. 7A.

FIG. 7A is a schematic plan view of a display device 1*a* according to an alternative embodiment. FIG. 7B is a schematic cross-sectional view of the display device 1*a* taken along line D-D' of FIG. 7A.

Referring to FIGS. 7A and 7B, an embodiment of the display device 1*a*, when viewed from a direction perpendicular to the substrate 100, for example, a z direction, each of the display panel 10 and the cover window CW may not have a sharp portion, and may have a circular or oval shape as a whole, as illustrated in FIG. 7A, when viewed in a thickness direction thereof.

The display panel 10 may include the substrate 100 and the pixels PX. The substrate 100 or the display panel 10 including the substrate 100 may include the display area DA having a circular or oval shape and the peripheral area PA surrounding the display area DA and arranged outside the display area DA.

The display area DA may include the front display area FDA and a curved display area BDA. The pixels PX arranged in each display area DA may display an image. In an embodiment, the pixels PX of each of the front display area FDA and the curved display area BDA may provide independent images. In an alternative embodiment, the pixels PX of each of the front display area FDA and the curved display area BDA may provide portions of any one image.

The front display area FDA is a flat display area, and the pixels PX each including a display element may be disposed therein. In an embodiment, the front display area FDA may provide most of an image.

The curved display area BDA is a flat display area, and the pixels PX each including a display element may be arranged therein. Accordingly, the curved display area BDA may display an image. The curved display area BDA may have a shape surrounding the front display area FDA. In an embodiment, for example, the curved display area BDA may have a ring shape around the front display area FDA. The curved display area BDA may be arranged between the front display area FDA and the peripheral area PA. The curved display area BDA may be bent at a radius of curvature.

In an embodiment, the display panel 10 may be disposed under the cover window CW, as illustrated in FIG. 7B. The display panel 10 may be attached to the cover window CW by a transparent adhesive member such as an OCA film, although not illustrated.

In an embodiment, the cover window CW may include, as illustrated in FIG. 7B, the flat area FA having a flat surface and the curved area BA having a curved shape. The flat area FA may overlap the front display area FDA of the display panel 10. The curved area BA may overlap the curved display area BDA and the peripheral area PA of the display panel 10.

The flat area FA, when viewed from a direction perpendicular to the substrate 100, for example, the z direction, may have a circular or oval shape.

The curved area BA, when viewed from the direction perpendicular to the substrate 100, for example, the z direction, may surround the flat area FA and have, for example, a ring shape. In an embodiment, the curved area BA may include a fifth curved area BA5 and a sixth curved area BA6. The fifth curved area BA5 may overlap the curved display area BDA of the display panel 10. The sixth curved area BA6 may overlap the peripheral area PA of the display panel 10.

The thickness of the fifth curved area BA5 may be substantially uniform or constant. A thickness tbb of the fifth curved area BA5 may be substantially the same as the thickness taa of the flat area FA. The thickness tbb of the fifth curved area BA5 may be greater than a thickness tcc of the sixth curved area BA6.

In the specification, the thickness tcc of the sixth curved area BA6 may be defined as a range of the thickness of the sixth curved area BA6 or an average thickness of the sixth curved area BA6.

The thickness tcc of the sixth curved area BA6 may be less than the thickness tbb of the fifth curved area BA5. In an embodiment, the thickness tcc of the sixth curved area BA6 may decrease as being away from the fifth curved area BA5. In an embodiment, the sixth curved area BA6 has a shape in which the thickness gradually decreases as being away from the fifth curved area BA5, but the disclosure is not limited thereto. In an alternative embodiment, the sixth curved area BA6 becomes thinner as being away from the fifth curved area BA5, but may include a discontinuous surface such as a step shape and the like.

The sixth curved area BA6 may include a first end portion E11 in contact with the fifth curved area BA5 and a second end portion E22 opposite to the first end portion E11. The second end portion E22 may be defined as a region including a point where the thickness of the sixth curved area BA6 discontinuously decreases as being away from the front display area FDA. The second end portion E22 is illustrated as having a trapezoidal shape in which the thickness decreases as being away from the front display area FDA, but the disclosure is not limited thereto. A thickness te11 of the first end portion E11 of the sixth curved area BA6 may be substantially the same as or less than the thickness tbb of the fifth curved area BA5. A thickness te22 of the second end portion E22 of the sixth curved area BA6 may be less than the thickness tbb of the fifth curved area BA5. The thickness te22 of the second end portion E22 of the sixth curved area BA6 may be less than the thickness te11 of the first end portion E11 of the sixth curved area BA6. In the specification, the thickness te22 of the second end portion E22 of the sixth curved area BA6 may be defined as the maximum thickness in the second end portion E22.

In an embodiment, the thickness te22 of the second end portion E22 of the sixth curved area BA6 may be in a range of about 60% to about 90% of the thickness tbb of the fifth curved area BA5. If the thickness te22 of the second end portion E22 of the sixth curved area BA6 is greater than the above range, the buckling of the curved display area BDA may occur during a process of attaching the cover window CW to the display panel 10. If the thickness te22 of the second end portion E22 of the sixth curved area BA6 is less than the above range, strength decreases so that the occurrence of scratch or damage may be increased.

As the sixth curved area BA6 overlapping the peripheral area PA of the display panel 10 has a shape in which the thickness gradually decreases, in the forming of a display device in which the cover window CW is attached to the display panel 10, the occurrence of bucking in the curved display area BDA of the display panel 10 may be effectively prevented or substantially reduced.

Figure 8:
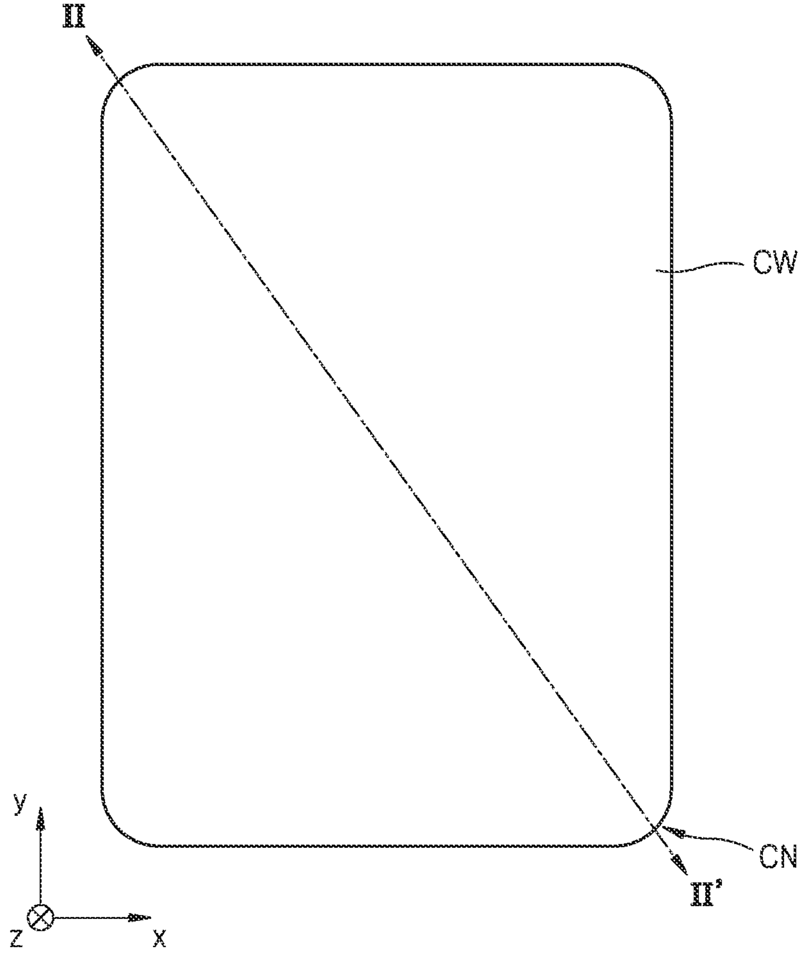
FIG. 8 is a plan view showing an operation of a method of manufacturing cover glass, according to an embodiment.
Figure 9:
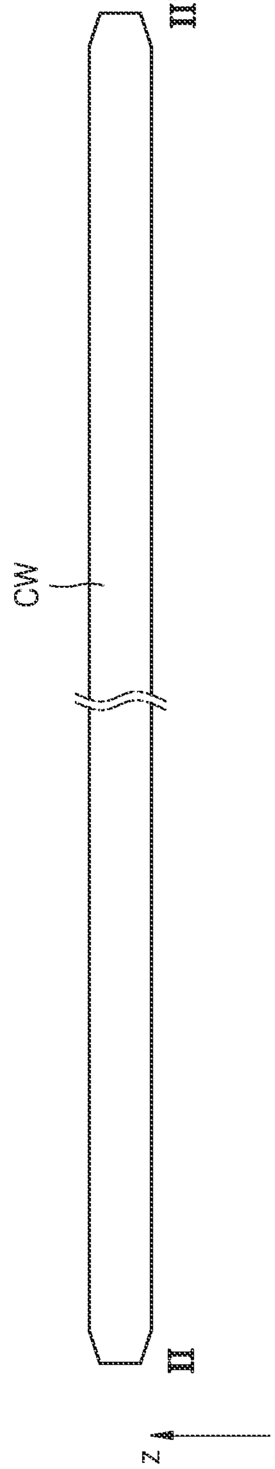
FIGS. 9 to 11 are schematic cross-sectional views showing an operation of forming a cover window in a method of manufacturing a display device, according to an embodiment.
Figure 10:
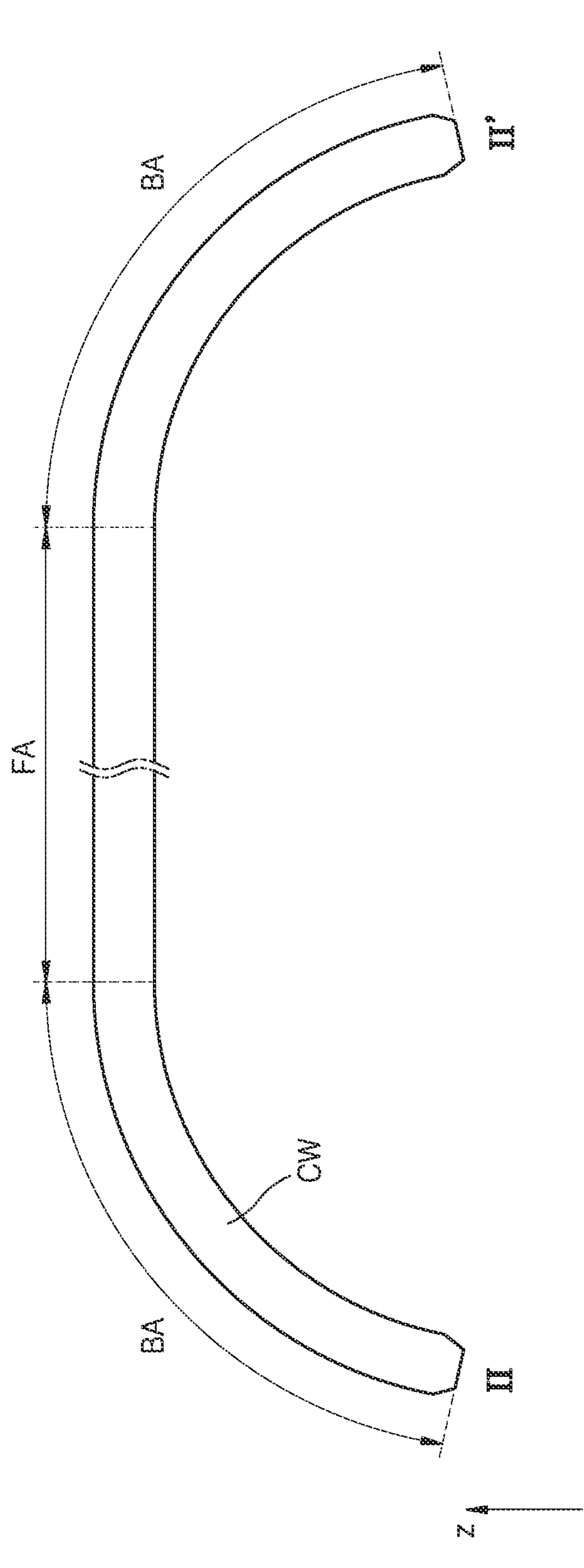
Figure 11:
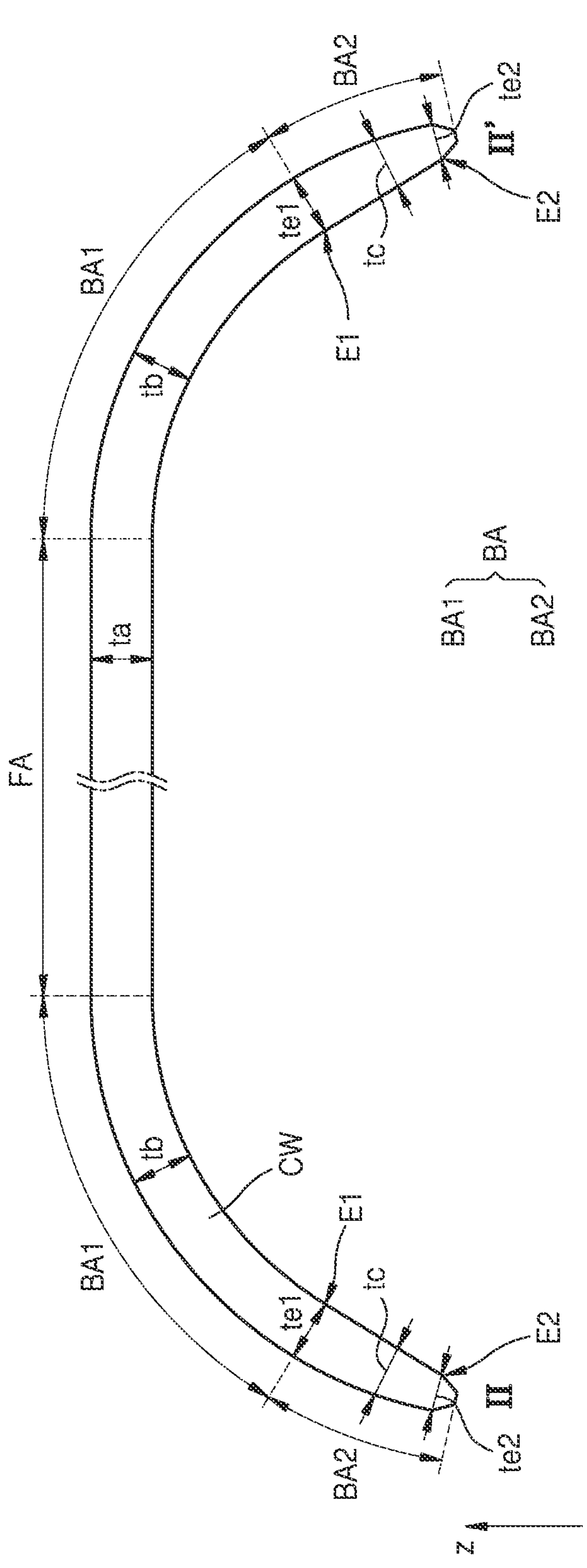

FIG. 8 is a plan view showing an operation of a method of manufacturing cover glass, according to an embodiment. FIGS. 9 to 11 are schematic cross-sectional views showing an operation of forming a cover window in a method of manufacturing a display device, according to an embodiment. FIGS. 9 to 11 are cross-sectional views taken along line II-II' of FIG. 8, showing the respective operations of a method of manufacturing a display device, according to an embodiment.

Referring to FIGS. 8 and 9, the cover window CW having a flat shape or in a flat state before forming curved areas may be prepared. The cover window CW may include the corner CN. The corner CN is a portion where the long side of the cover window CW in the first direction (e.g., the y direction or the −y direction) meets the short side of the cover window CW in the second direction (e.g., the x direction or the −x direction).

Referring to FIG. 10, the cover window CW may be deformed (or curved) to have the flat area FA and the curved area BA. In an embodiment, although not illustrated for convenience, the cover window CW may be deformed to have the flat area FA and the curved area BA, by using a jig JIG, as illustrated in FIG. 15A, having a concave surface corresponding to the final shape of the cover window CW.

Referring to FIG. 11, the first curved area BA1 and the second curved area BA2 may be formed by removing a portion of the cover window CW in some areas arranged in the edge of the curved area BA. In an embodiment, the first curved area BA1 and the second curved area BA2 may be formed by removing a portion of the cover window CW in some areas arranged in the corner CN (see FIG. 1) of the curved area BA. In an embodiment, for example, the second curved area BA2 may be formed by removing a portion of the cover window CW overlapping the first peripheral area PA1 of the display panel 10. In an embodiment, for example, as the portion of the cover window CW overlapping the corner display area CDA of the display panel 10 is not removed, the first curved area BA1 distinguished from the second curved area BA2 may be formed.

In an embodiment, the second curved area BA2 may be formed by removing a portion of a lower surface of the cover window CW. Accordingly, the second curved area BA2 may be formed to have the thickness tc less than the thickness tb of the first curved area BA1. In an embodiment, the second curved area BA2 may be formed to have the thickness tc that decreases as being away from the first curved area BA1. In an embodiment, the second curved area BA2 may be formed to have a shape in which the thickness gradually decreases as being away from the first curved area BA1, but the disclosure is not limited thereto. In an alternative embodiment, the second curved area BA2 may be formed to have the thickness that gradually decreases as being away from the first curved area BA1, but may be formed to have a discontinuous surface such as a step shape and the like.

The second curved area BA2 may include the first end portion E1 in contact with the first curved area BA1 and the second end portion E2 opposite to the first end portion E1. The second end portion E2 of the second curved area BA2 may be formed to have the thickness te2 that is less than the thickness tb of the first curved area BA1. The second end portion E2 of the second curved area BA2 may be formed to have the thickness te2 that is less than the thickness te1 of the first end portion E1 of the second curved area BA2.

In an embodiment, the second end portion E2 of the second curved area BA2 may be formed to have the thickness te2 in a range of about 60% to about 90% of the thickness tb of the first curved area BA1. If the thickness te2 of the second end portion E2 of the second curved area BA2 is greater than the above range, the buckling of the corner display area CDA may occur during a process of attaching the cover window CW to the display panel 10. If the thickness te2 of the second end portion E2 of the second curved area BA2 is less than the above range, strength decreases so that the occurrence of scratch or damage may be increased.

In an embodiment, the cover window CW may be partially removed by a mechanical polishing process, but the disclosure is not limited thereto.

In an embodiment, where a portion of the cover window CW is removed only from the corner of the cover window CW, as illustrated in FIGS. 4B and 4C, the third curved area BA3 and the fourth curved area BA4 having substantially a same thickness as each other may be formed.

In FIGS. 9 to 11, a portion of the cover window CW is described as being removed in the corner of the cover window CW along line II-II', but the disclosure is not limited thereto. In an embodiment, in the cover window CW, a portion of the edge of the cover window CW in the x direction or the y direction, other than the corner, may be removed in a same operation and by a same method as the operation of forming the first and second curved areas BA1 and BA2. In such an embodiment, by removing a portion of the cover window CW overlapping the second peripheral area PA2 of the display panel 10 in the subsequent process, as illustrated in FIGS. 5A and 5B, the fourth curved area BA4 having a thickness less than a thickness of the third curved area BA3 and the third curved area BA3 may be formed.

Figure 12:
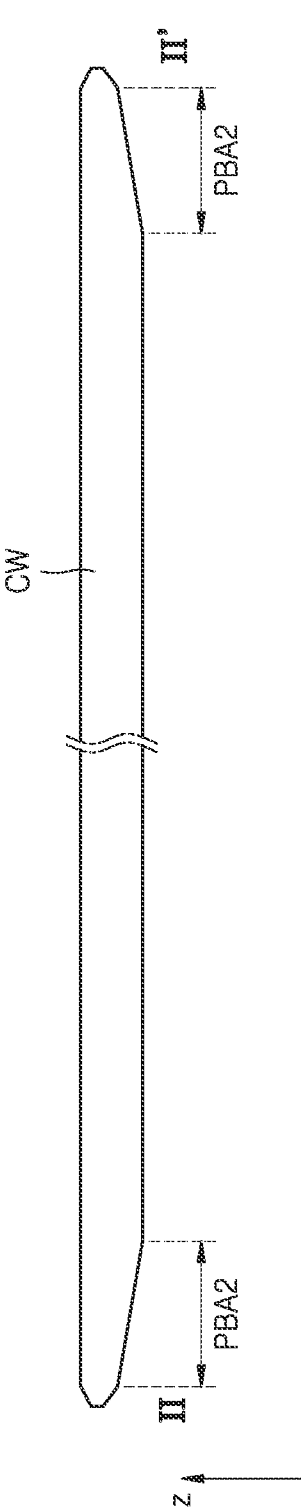
FIGS. 12 and 13 are schematic cross-sectional views showing an operation of forming a cover window in a method of manufacturing a display device, according to an alternative embodiment.
Figure 13:
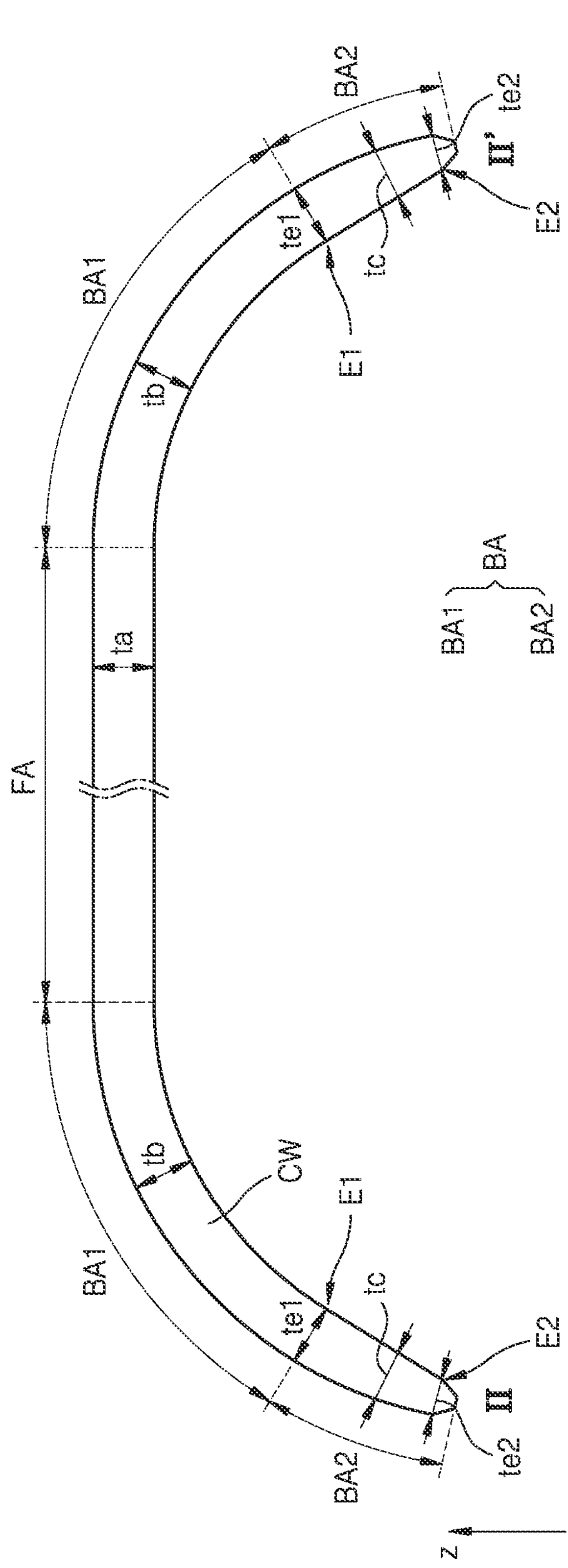

FIGS. 12 and 13 are schematic cross-sectional views showing an operation of forming a cover window in a method of manufacturing a display device, according to an alternative embodiment. FIGS. 12 and 13 are cross-sectional views taken along II-II' of FIG. 8, showing the respective operations of a method of manufacturing a display device, according to an alternative embodiment. In an embodiment, as described above with reference to FIGS. 9 to 11, the cover window CW may be deformed to have the flat area FA and the curved area BA and a portion thereof is removed, thereby forming the first curved area BA1 and the second curved area BA2. In an alternative embodiment, referring to FIGS. 12 and 13, after removing a portion of the cover window CW in a flat state from the edge area, the cover window CW may be deformed (or curved) to have the flat area FA and the curved area BA.

Referring to FIG. 12, a portion of the cover window CW may be removed from an area where the edge of the cover window CW is arranged. In such an embodiment, by the subsequent process, a portion of the lower surface of the cover window CW overlapping the first peripheral area PA1 may be removed from a preliminary second curved area PBA2. The preliminary second curved area PBA2 may have a shape in which the thickness decreases as being away from the center of the cover window CW.

Referring to FIG. 13, the cover window CW may be deformed to have the flat area FA and the curved area BA. Although not illustrated for convenience, the cover window CW may be deformed to have the flat area FA and the curved area BA, by using the jig JIG, as illustrated in FIG. 15A, having a concave surface corresponding to the final shape of the cover window CW. The curved area BA may include the first curved area BA1 having a uniform thickness and the second curved area BA2 obtained by bending the preliminary second curved area PBA2.

FIGS. 14A to 14D are schematic views showing an operation of preparing a display panel in a method of manufacturing a display device, according to an embodiment.

Figure 14A:
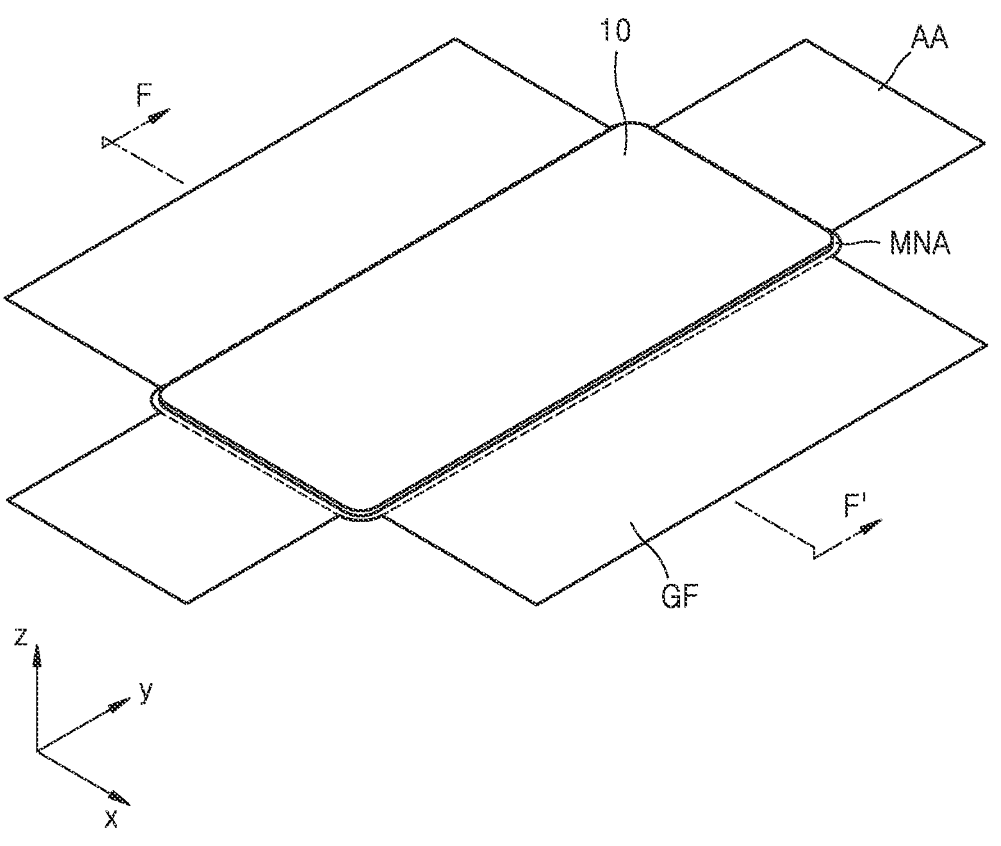
FIGS. 14A to 14D are schematic views showing an operation of preparing a display panel in a method of manufacturing a display device, according to an embodiment.
Figure 14B:
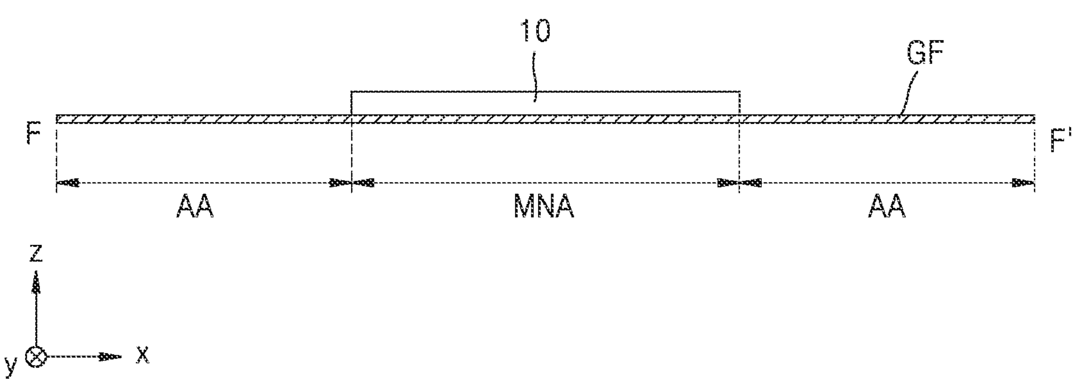

FIGS. 14A and 14B are views showing an operation of attaching a guide film to a display panel. In detail, FIG. 14B is a schematic cross-sectional view of a guide film GF and the display panel 10 of FIG. 14A taken along line F-F'.

As illustrated in FIGS. 14A and 14B, the guide film GF may be attached to a lower portion of the display panel 10. The guide film GF may include a main area MNA and an auxiliary area AA. The auxiliary area AA may include a plurality of auxiliary areas, and each of the auxiliary areas AA may extend from an edge of the main area MNA. The guide film GF may be attached to the lower portion of the display panel 10 such that the display panel 10 corresponds to the main area MNA of the guide film GF. In an embodiment, the guide film GF may be attached to the lower portion of the display panel 10 such that the display panel 10 entirely corresponds to the main area MNA of the guide film GF. In such an embodiment, the auxiliary area AA of the guide film GF may not overlap the display panel 10.

Figure 14C:
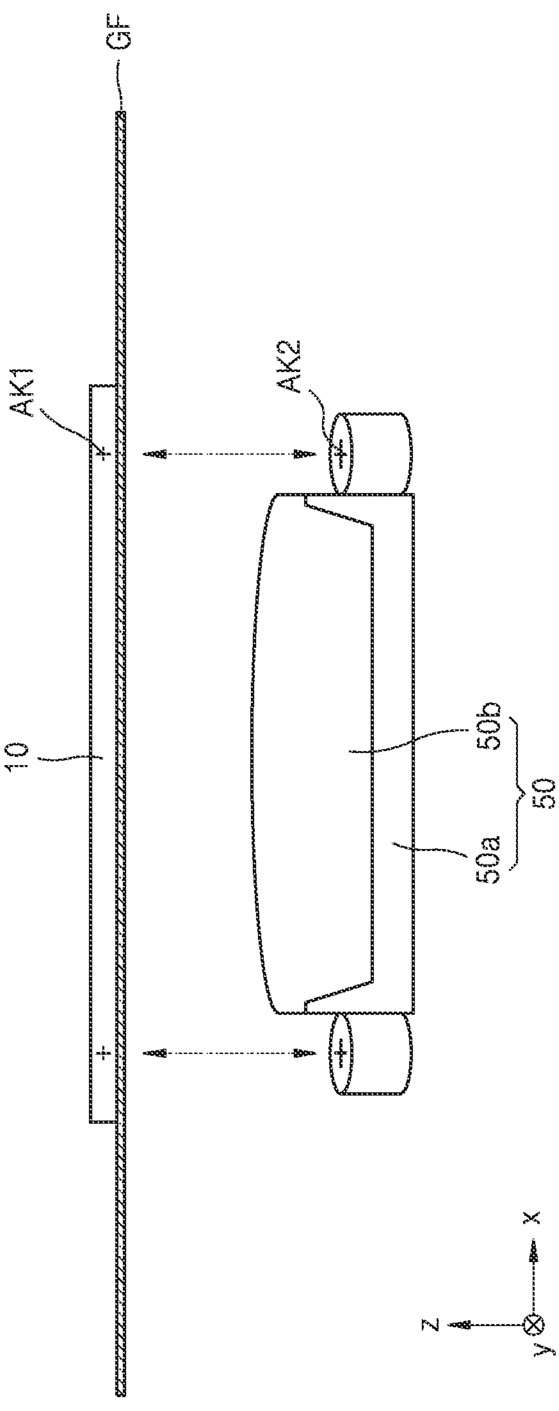
Figure 14C:
Figure 14D:
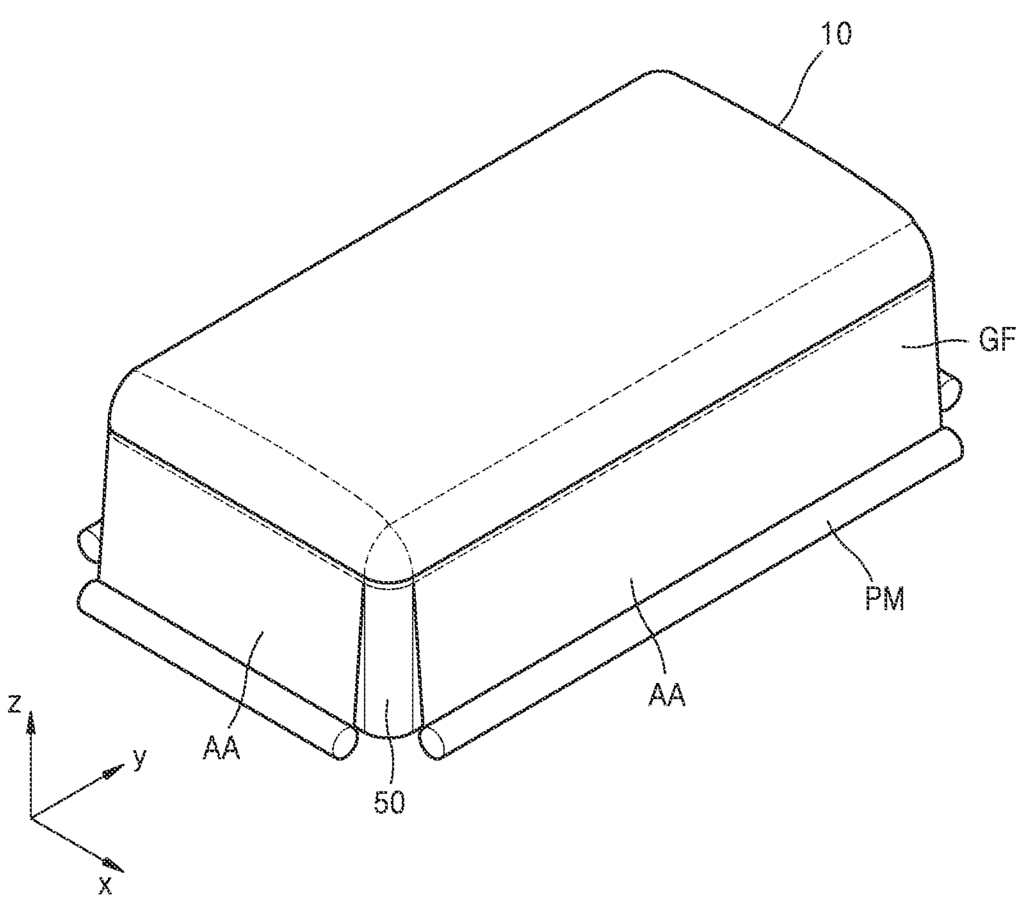

FIGS. 14C and 14D are views showing an operation of preliminarily forming a display panel. The display panel 10 may be deformed by applying an external force to the guide film GF, as illustrated in FIGS. 14C and 14D. In such an embodiment, the display panel 10 may be preliminarily formed by applying an external force to the guide film GF.

First, as illustrated in FIG. 14C, the lower surface (in the −z direction) of the display panel 10 to which the guide film GF is attached is arranged to face a pad portion 50, and then, the display panel 10 and the pad portion 50 may be aligned with each other. In detail, the display panel 10 and the pad portion 50 may be aligned with each other such that a first alignment key AK1 marked on the display panel 10 matches a second alignment key AK2 marked on the pad portion 50.

The pad portion 50 may include a first pad portion 50*a* and a second pad portion 50*b*. The first pad portion 50*a* may support the second pad portion 50*b*. The second pad portion 50*b* may include an air pump or may be connected to an air pump. The second pad portion 50*b* has a low modulus so that the shape and volume of the second pad portion 50*b* may be varied by applying an air pressure through the air pump. Alternatively, the second pad portion 50*b* may include a diaphragm.

As illustrated in FIG. 14D, the guide film GF attached to the lower surface (in the −z direction) of the display panel 10 may be placed on the pad portion 50. A push member PM may be arranged on the guide film GF, and the guide film GF may be brought into close contact with a side surface of the pad portion 50 by using the push member PM. In an embodiment, for example, as the push members PM respectively press the edges of the guide film GF, tensile force is applied to the guide film GF and the guide film GF is deformed along the outer surface of the pad portion 50, and thus, the display panel 10 on the guide film GF may be deformed, e.g., appropriately bent and the like. Accordingly, the display panel 10 may be preliminarily formed into a shape matching the cover window CW.

Figure 15A:
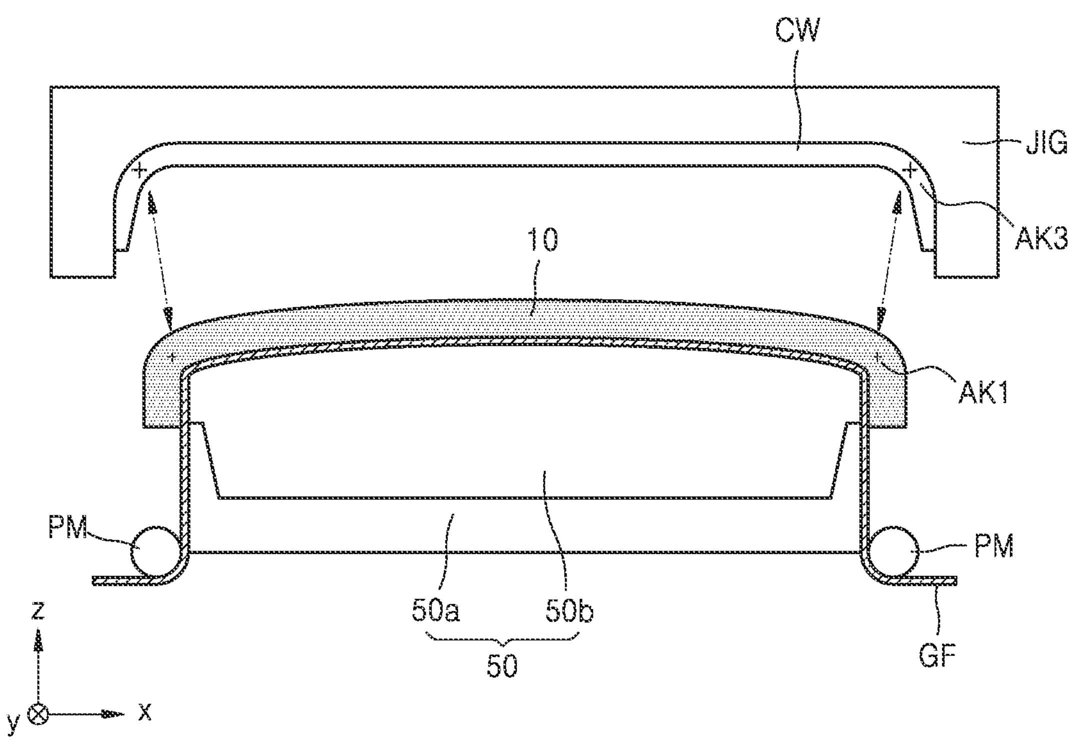
FIGS. 15A to 15C are schematic cross-sectional views showing an operation of attaching a cover window to a display panel in a method of manufacturing a display device, according to an embodiment.
Figure 15B:
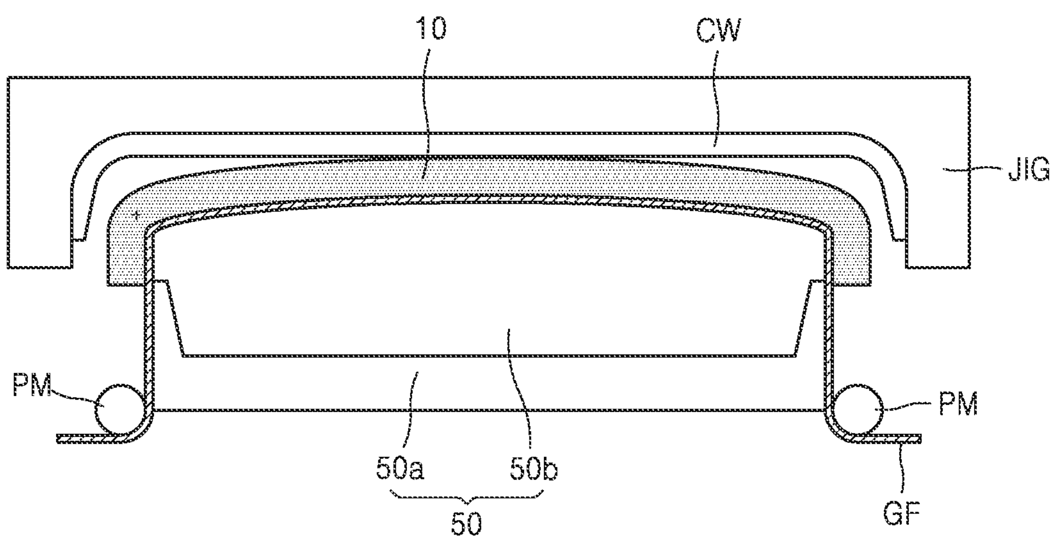
Figure 15C:
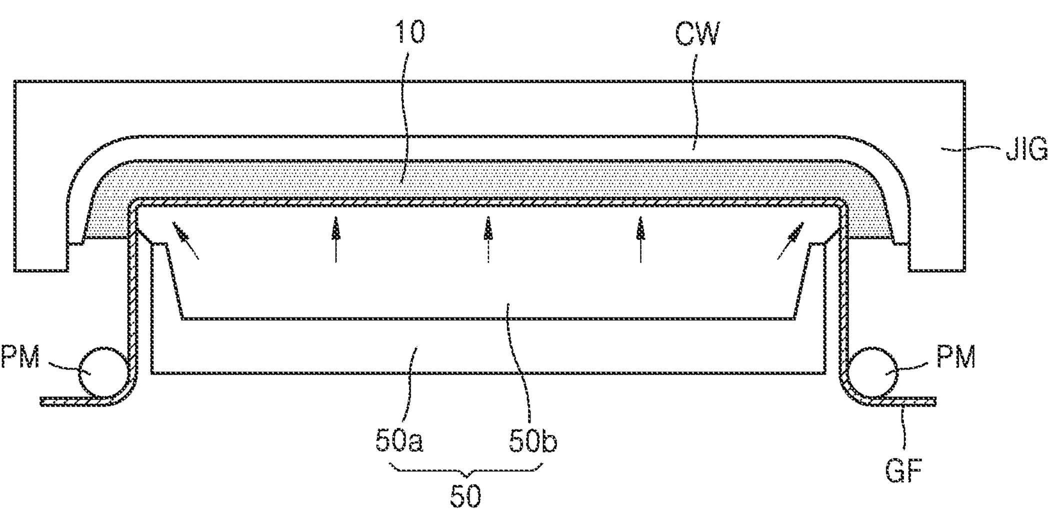

FIGS. 15A to 15C are schematic cross-sectional views showing an operation of attaching a cover window to a display panel in a method of manufacturing a display device, according to an embodiment. The cover window CW may be formed by the manufacturing method described with reference to FIGS. 8 to 11, or by the manufacturing method described with reference to FIGS. 12 and 13, thereby having the characteristics described above. FIGS. 15A to 15C illustrate cross-sections in an x-axis direction, showing that the edge area of the cover window CW becomes thinner, but the disclosure is not limited thereto. In an alternative embodiment, for example, the thickness of the cover window CW may be uniform in a cross-section in the x-axis direction and a cross-section in a y-axis direction. Even in this case, however, the thickness of in some areas of the cover window CW in the cross-section crossing the corner may have a shape in which the thickness decreases, as illustrated in FIG. 4A.

First, as illustrated in FIG. 15A, the display panel 10 is arranged such that the upper surface (in the +z direction) of the display panel 10 faces the cover window CW, and then, the display panel 10 and the cover window CW may be aligned with each other. In an embodiment, the display panel 10 and the cover window CW may be aligned with each other such that the first alignment key AK1 marked on the display panel 10 matches a third alignment key AK3 marked on the cover window CW.

Next, as illustrated in FIGS. 15B and 15C, the cover window CW may be attached to the display panel 10 by using the pad portion 50. As illustrated in FIG. 15B, a portion of the display panel 10 may be first attached to the cover window CW. A flat surface (e.g., the front display area FDA of FIG. 1) having no curvature in the final shape of the display panel 10 may be first attached to the cover window CW.

Next, as illustrated in FIG. 15C, as the shape of the second pad portion 50*b* of the pad portion 50 is changed and the volume of the second pad portion 50*b* increases, the other portions of the display panel 10, for example, the side display area SDA of FIG. 1 and the corner display area CDA of FIG. 1, may be attached to the cover window CW. The process of attaching the side display area SDA to the cover window CW and the process of attaching the corner display area CDA to the cover window CW maybe simultaneously performed. In an embodiment, for example, when the side display area SDA is attached to the cover window CW, the corner display area CDA may be naturally attached to the cover window CW by a peripheral external force. In an alternative embodiment, for example, the process of attaching the side display area SDA to the cover window CW and the process of attaching the corner display area CDA to the cover window CW may be performed at different timings. In an embodiment, for example, after the side display area SDA is first attached to the cover window CW, the corner display area CDA may be attached to the cover window CW. After the cover window CW is attached to the display panel 10, the display panel 10 to which the cover window CW is attached may be separated from the jig JIG and the pad portion 50.

According to the embodiments described above, as the cover window has a shape in which the thickness decreases in an area overlapping an area where pixels of a display panel are not arranged, the buckling of a display panel that may occur during a process of attaching the cover window to the display panel may be effectively prevented or substantially reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a display panel comprising corner areas; and a cover window disposed on the display panel, wherein the display panel comprises a substrate and a plurality of pixels on the substrate, the substrate comprising a display area, a first peripheral area, and a second peripheral area, the display area comprising a front display area, a corner display area bent in each of the corner areas, and a side display area arranged at a side of the front display area, wherein the first peripheral area is arranged outside the corner display area, the second peripheral area is arranged outside the side display area, and the plurality of pixels is arranged in the display area, the cover window comprises a flat area overlapping the front display area and a curved area bent with respect to the flat area, the curved area comprises a first curved area overlapping the corner display area and a second curved area extending from the first curved area and overlapping the first peripheral area, and a thickness of the second curved area is less than a thickness of the first curved area.

2. The display device of claim 1, wherein the second curved area comprises a first end portion in contact with the first curved area and a second end portion opposite to the first end portion, and a thickness of the second end portion is less than a thickness of the first end portion.

3. The display device of claim 2, wherein the thickness of the second end portion of the second curved area is in a range of 60% to 90% of the thickness of the first curved area.

4. The display device of claim 1, wherein the thickness of the second curved area decreases as being away from the first curved area.

5. The display device of claim 1, wherein the thickness of the first curved area is uniform.

6. The display device of claim 5, wherein the thickness of the first curved area is the same as a thickness of the flat area.

7. The display device of claim 1, wherein the curved area further comprises a third curved area overlapping the side display area and a fourth curved area extending from the third curved area and overlapping the second peripheral area.

8. The display device of claim 7, wherein a thickness of each of the third curved area and the fourth curved area is uniform.

9. The display device of claim 8, wherein the thickness of the third curved area is the same as a thickness of the flat area.

10. The display device of claim 7, wherein a thickness of the fourth curved area is less than a thickness of the third curved area.

11. The display device of claim 10, wherein the thickness of the fourth curved area decreases as being away from the third curved area.

12. A display device comprising:

a display panel comprising corner areas; and a cover window disposed on the display panel, wherein the display panel comprises a substrate and a plurality of pixels, the substrate comprising a display area, a first peripheral area, and a second peripheral area, the display area comprising a front display area, a corner display area bent in each of the corner areas, and a side display area arranged at a side of the front display area, wherein the first peripheral area is arranged outside the corner display area, the second peripheral area is arranged outside the side display area, and the plurality of pixels is arranged in the display area, the cover window comprises a flat area overlapping the front display area and a curved area bent with respect to the flat area, the curved area comprises a first curved area overlapping the corner display area, a second curved area extending from the first curved area and overlapping the first peripheral area, a third curved area overlapping the side display area, and a fourth curved area extending from the third curved area and overlapping the second peripheral area, a thickness of the second curved area is less than a thickness of the first curved area, and a thickness of the third curved area is the same as a thickness of the fourth curved area.

13. The display device of claim 12, wherein the second curved area comprises a first end portion in contact with the first curved area and a second end portion opposite to the first end portion, and a thickness of the second end portion is less than a thickness of the first end portion.

14. The display device of claim 13, wherein the thickness of the second end portion of the second curved area is in a range of 60% to 90% of the thickness of the first curved area.

15. The display device of claim 12, wherein the thickness of the second curved area decreases as being away from the first curved area.

16. The display device of claim 12, wherein the thickness of the first curved area is uniform.

17. The display device of claim 12, wherein each of the thickness of the first curved area and the thickness of the third curved area is the same as the thickness of the flat area.

18. A display device comprising:

a display panel comprising a substrate and a plurality of pixels on the substrate, the substrate comprising a display area and a peripheral area arranged outside the display area, wherein the plurality of pixels is arranged in the display area; and a cover window disposed on the display panel, wherein the cover window comprises a flat area having a flat surface and a curved area having a curved shape and overlapping a portion of the display area and the peripheral area, a portion of the curved area overlapping the display area has a uniform thickness, and a portion of the curved area overlapping the peripheral area has a thickness decreasing as being away from the flat area.

19. The display device of claim 18, wherein the display panel comprises corner areas, and the display area comprises a front display area, a corner display area bent in each of the corner areas, and a side display area arranged at a side of the front display area between the corner areas.

20. The display device of claim 19, wherein the peripheral area comprises a first peripheral area arranged outside the corner display area in each of the corner areas, and a second peripheral area arranged outside the side display area, the curved area comprises a first curved area overlapping the side display area and a second curved area overlapping the first peripheral area, and the second curved area has a thickness decreasing as being away from the first curved area.

21. The display device of claim 18, wherein each of the display panel and the cover window is circular.

* * * * *